(12) United States Patent
Tsuru et al.

(10) Patent No.: US 7,675,376 B2
(45) Date of Patent: Mar. 9, 2010

(54) VOLTAGE-CONTROLLED OSCILLATOR

(75) Inventors: Masaomi Tsuru, Tokyo (JP); Kenji Kawakami, Tokyo (JP); Kenichi Tajima, Tokyo (JP); Moriyasu Miyazaki, Tokyo (JP); Kazuhiro Miyamoto, Tokyo (JP); Masafumi Nakane, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 160 days.

(21) Appl. No.: 11/629,531

(22) PCT Filed: Mar. 7, 2005

(86) PCT No.: PCT/JP2005/003898

§ 371 (c)(1),
(2), (4) Date: Dec. 14, 2006

(87) PCT Pub. No.: WO2005/124992

PCT Pub. Date: Dec. 29, 2005

(65) Prior Publication Data

US 2007/0247244 A1    Oct. 25, 2007

(30) Foreign Application Priority Data

Jun. 18, 2004    (WO) ............... PCT/JP2004/008957

(51) Int. Cl.
*H03B 5/18* (2006.01)
(52) U.S. Cl. ............ 331/177 V; 331/36 C; 331/117 FE
(58) Field of Classification Search ............. 331/36 C, 331/117 FE, 177 V
See application file for complete search history.

(56) References Cited

U.S. PATENT DOCUMENTS

| 4,590,443 | A | | 5/1986 | Ishigaki et al. |
| 4,868,526 | A | * | 9/1989 | Camiade et al. ........ 331/117 FE |
| 7,268,634 | B2 | * | 9/2007 | Luong et al. ............ 331/36 L |
| 2001/0026195 | A1 | | 10/2001 | Tokumitsu et al. |
| 2001/0035794 | A1 | | 11/2001 | Fujidai et al. |

FOREIGN PATENT DOCUMENTS

GB    2 240 227 A    7/1991

(Continued)

OTHER PUBLICATIONS

Svilen Kolev, Bruno Delacressonniere, Jean-Luc autier, Using a Negative Capacitance to Increase the Tuning Range of a Varactor Diode in MMIC Technology, IEEE Transactions on Microwave Theory and Techniques, vol. 49, No. 12, pp. 2425 to 2430, 2001.12, full text, all drawings.

(Continued)

*Primary Examiner*—Robert Pascal
*Assistant Examiner*—James E Goodley
(74) *Attorney, Agent, or Firm*—Birch, Stewart, Kolasch & Birch, LLP

(57) ABSTRACT

A voltage-controlled oscillator has a tuned circuit for controlling the oscillation frequency. The tuned circuit has a variable-capacitance element whose capacitance varies in response to a control voltage and a negative capacitance circuit whose impedance frequency characteristics have opposite characteristics to those of a normal capacitance, and which is connected to the variable-capacitance element. The configuration enables increasing the variation ratio corresponding to the control voltage of the combined capacitance composed of the variable-capacitance element and negative capacitance circuit, thereby broadening the oscillation frequency band.

36 Claims, 25 Drawing Sheets

FOREIGN PATENT DOCUMENTS

| | | |
|---|---|---|
| JP | 49-82250 A | 8/1974 |
| JP | 58-85603 A | 5/1983 |
| JP | 60-190004 A | 9/1985 |
| JP | A 5-300013 | 11/1993 |
| JP | 6-252640 A | 9/1994 |
| JP | A 8-23229 | 1/1996 |
| JP | 08-335828 A | 12/1996 |
| JP | 11-41031 A | 2/1999 |
| JP | 11-186844 A | 7/1999 |
| JP | 2001-160712 A | 6/2001 |
| JP | 2001-313526 A | 11/2001 |
| JP | 2003-332841 A | 11/2003 |

OTHER PUBLICATIONS

Svilen Kolev, Bruno Delacressonniere, Jean-Luc Gautier, Using a Negative Capacitance to Increase the Tuning Range of a Varactor Diode in MMIC Technology, 2001 IEEE MTT-S Digest, TH2B-2, pp. 1581 to 1584, 2001, Fig. 2-3.

Svilen Kolev, et al., "Novel Microwave Negative Capacitance. Application to a Wide-Range Tunable Capacitance", pp. 87-89, 30th European Conference, Paris, 2000.

Svilen Kolev, et al., Using a Negative Capacitance to Increase the Tuning Range of a Varactor Diode in MMIC Technology, vol. 3, pp. 1581-1584, IEEE MTT-S Digest, 2001.

Bowick, "RF Circuit Design", 1982, XP-002483502, pp. 12-17.

\* cited by examiner

US 7,675,376 B2

VOLTAGE-CONTROLLED OSCILLATOR

TECHNICAL FIELD

The present invention relates to a voltage-controlled oscillator with a broadened oscillation frequency band.

BACKGROUND ART

As a conventional voltage-controlled oscillator, there is one that has an active element for oscillation composed of a field-effect transistor; a first reactance circuit connected to the source terminal of the field-effect transistor; a second reactance circuit connected to the gate terminal of the field-effect transistor; a third reactance circuit connected to the drain terminal of the field-effect transistor; a load resistance connected to the third reactance circuit for outputting the oscillation power amplified by the field-effect transistor; and a variable-capacitance element provided to the first reactance circuit for varying the capacitance in response to a control voltage as a tuned circuit for controlling the oscillation frequency.

The operation is as follow: Noise within the voltage-controlled oscillator circuit is amplified by the active element for oscillation, part of the amplified power is fed back to the active element for oscillation through the first to third reactance circuits connected to the active element for oscillation, and the active element for oscillation further amplifies the power, thereby carrying out the oscillation operation and causing the oscillation output to be produced from the load resistance. The oscillation frequency is determined by the resonance frequency of the tuned circuit. To control the oscillation frequency, the junction capacitance of the variable-capacitance element is varied by varying the control voltage applied to the variable-capacitance element, thereby varying the resonance frequency of the tuned circuit. Thus, the oscillation frequency varies. The relation between the oscillation frequency and the junction capacitance of the variable-capacitance element is given by the following expression.

$$(f_{max}/f_{min})^2 \propto C_{j\text{-}max}/C_{j\text{-}min}$$

where $f_{max}$ and $f_{min}$ are a maximum oscillation frequency and minimum oscillation frequency, respectively, and $C_{j\text{-}max}$ and $C_{j\text{-}min}$ are a maximum variable-capacitance value and minimum variable-capacitance value (for example, see Patent Document 1).

Patent Document 1: Japanese patent application laid-open No. 8-335828/1996.

With the foregoing configuration, the conventional voltage-controlled oscillator achieves a broad oscillation frequency band by greatly varying the junction capacitance of the variable-capacitance element. The conventional voltage-controlled oscillator, however, has a problem in that its oscillation frequency band is limited by a fixed capacitance in the active element for oscillation or in the reactance circuit, and the variation ratio of the junction capacitance of the variable-capacitance element.

The present invention is implemented to solve the foregoing problem. Therefore it is an object of the present invention to provide a voltage-controlled oscillator capable of broadening the oscillation frequency band by equivalently increasing the variation ratio of the capacitance of a combined variable-capacitance element.

DISCLOSURE OF THE INVENTION

The voltage-controlled oscillator in accordance with the present invention has a negative capacitance circuit that has impedance frequency characteristics opposite to the characteristics of a normal capacitance, and is connected to the variable-capacitance element.

Thus, it offers an advantage of being able to broaden the oscillation frequency band by increasing the variation ratio of the combined capacitance composed of the variable-capacitance element and negative capacitance circuit in response to the control voltage.

BEST MODE FOR CARRYING OUT THE INVENTION

The best mode for carrying out the invention will now be described with reference to the accompanying drawings to explain the present invention in more detail.

Embodiment 1

Figure 1:
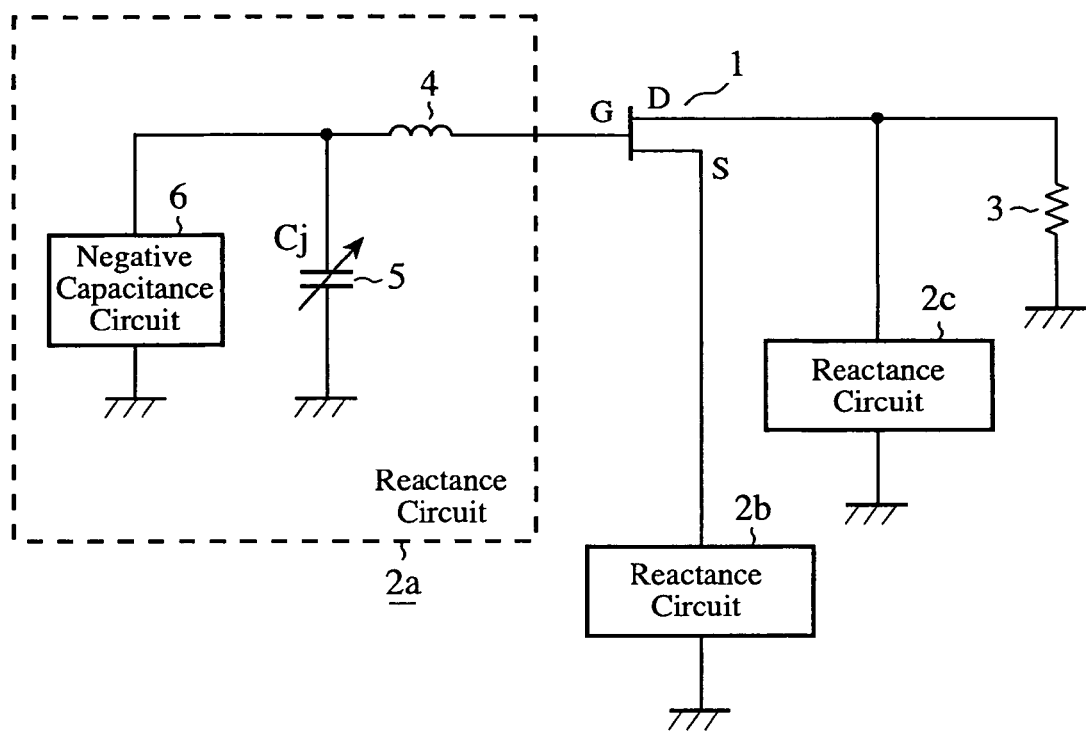
FIG. 1 is a circuit diagram showing a voltage-controlled oscillator of an embodiment 1 in accordance with the present invention.

FIG. 1 is a circuit diagram showing a voltage-controlled oscillator of an embodiment 1 in accordance with the present invention. In FIG. 1, a field-effect transistor 1 operates as an active element for oscillation for amplifying power within the voltage-controlled oscillator circuit. A reactance circuit (first reactance circuit) 2a is connected to the gate terminal (first terminal) of the field-effect transistor 1, a reactance circuit (second reactance circuit) 2b is connected to the source terminal (second terminal) of the field-effect transistor 1, and a reactance circuit (third reactance circuit) 2c is connected to the drain terminal (third terminal) of the field-effect transistor 1. A load resistance 3, which is connected in parallel with the reactance circuit 2c, outputs the oscillation power amplified by the field-effect transistor 1.

An inductor 4 in the reactance circuit 2a is connected in series with the gate terminal of the field-effect transistor 1. A variable-capacitance element 5, which is composed of a varactor diode or the like, is connected in series with the inductor 4, and its capacitance is varied in response to the control voltage. A negative capacitance circuit 6, which is connected in parallel with the variable-capacitance element 5, has impedance frequency characteristics opposite to those of the normal capacitance.

The reactance circuit 2a including the variable-capacitance element 5 connected thereto constitutes a tuned circuit for controlling the oscillation frequency.

Next, the operation will be described.

The voltage-controlled oscillator as shown in FIG. 1 carries out the oscillation operation as follows, and produces the oscillation output from the load resistance 3. More specifically, the field-effect transistor 1 amplifies the power within the voltage-controlled oscillator circuit; the reactance circuits 2a-2c connected to the individual terminals of the field-effect transistor 1 feed part of the amplified power back to the field-effect transistor 1; and the field-effect transistor 1 further amplifies the power and outputs it. The oscillation frequency is determined by the resonance frequency of the tuned circuit. To control the oscillation frequency, varying the control voltage applied to the variable-capacitance element 5 causes the junction capacitance $C_j$ of the variable-capacitance element to vary, thereby varying the resonance frequency of the tuned circuit. Thus, the oscillation frequency varies.

Figure 2:
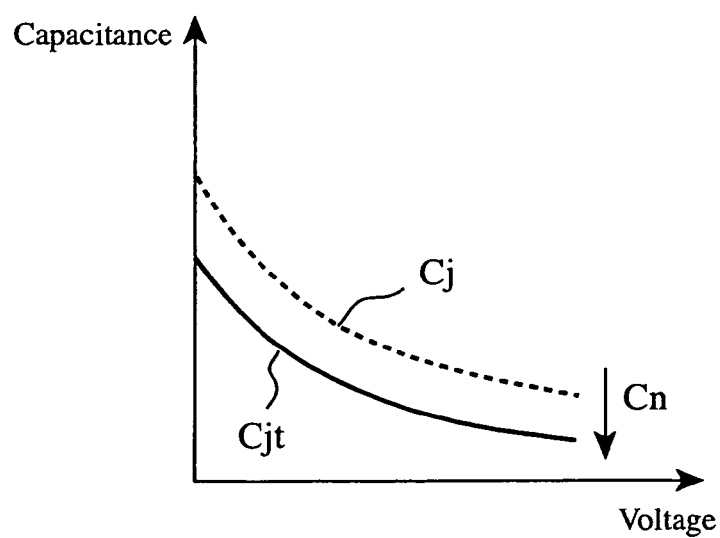
FIG. 2 is a characteristic diagram illustrating variations in the combined capacitance of the variable-capacitance element and negative capacitance circuit of the voltage-controlled oscillator of the embodiment 1 in accordance with the present invention.

FIG. 2 is a characteristic diagram illustrating variations in the combined capacitance of the variable-capacitance element and negative capacitance circuit of the voltage-controlled oscillator of the embodiment 1 in accordance with the present invention. In the present embodiment 1, since the negative capacitance circuit 6 is connected in parallel with the variable-capacitance element 5, the junction capacitance $C_j$ of the variable-capacitance element 5 is reduced by the capacitance $|-C_n|$ of the negative capacitance circuit 6 as illustrated in FIG. 2. Accordingly, the combined capacitance $C_{jt}$ is given by $C_{jt}=C_j-C_n$ (where $C_n>0$). The variation ratio $C_{jt\_rate}$ of the combined capacitance is given by the following expression (1), which indicates an increase in the variation ratio.

$$C_{jt\_rate} = \frac{C_{j\_max}}{C_{j\_min}} \cdot \frac{1 - \dfrac{C_n}{C_{j\_max}}}{1 - \dfrac{C_n}{C_{j\_min}}} \left(1 - \frac{C_n}{C_{j\_max}}\right) > \left(1 - \frac{C_n}{C_{j\_min}}\right), \quad (1)$$

$$C_n > C_{j\_min}$$

As a result, a broad oscillation frequency band is obtained.

Figure 3:
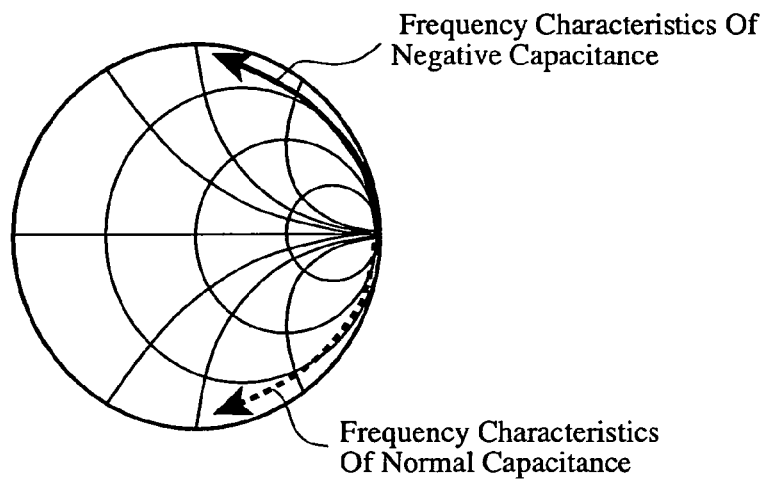
FIG. 3 is a Smith chart illustrating frequency characteristics of the negative capacitance circuit.

FIG. 3 is a Smith chart illustrating the frequency characteristics of the negative capacitance circuit. As illustrated in FIG. 3, the negative capacitance circuit 6 has the opposite direction to the normal capacitance for the frequency on the Smith chart.

As described above, the present embodiment 1 can broaden the oscillation frequency band by increasing the variation ratio corresponding to the control voltage of the combined capacitance composed of the variable-capacitance element 5 and negative capacitance circuit 6 by connecting the negative capacitance circuit 6 in parallel with the variable-capacitance element 5.

In addition, the active element for oscillation can be easily configured by the field-effect transistor 1.

Incidentally, although the foregoing embodiment 1 constructs the tuned circuit for controlling the oscillation frequency from the reactance circuit 2a including the variable-capacitance element 5, this is not essential. For example, a variable-capacitance element can be provided not only to the reactance circuit 2a, but also to the reactance circuit 2b or reactance circuit 2c, or to both the reactance circuits 2b and 2c. In this case, the reactance circuit including the variable-capacitance element can operate as a tuned circuit for controlling the oscillation frequency.

Embodiment 2

Figure 4:
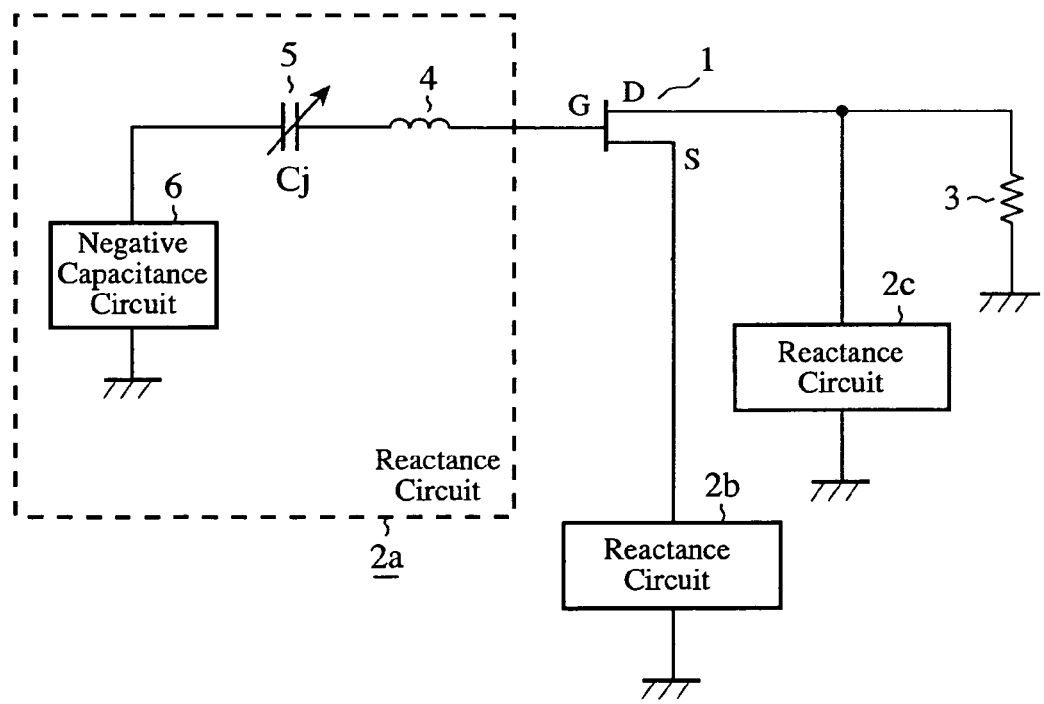
FIG. 4 is a circuit diagram showing a voltage-controlled oscillator of an embodiment 2 in accordance with the present invention.

FIG. 4 is a circuit diagram showing a voltage-controlled oscillator of an embodiment 2 in accordance with the present invention. In FIG. 4, the negative capacitance circuit 6 is connected in series with the variable-capacitance element 5. The remaining configuration is the same as that of FIG. 1.

Next, the operation will be described.

Although the negative capacitance circuit 6 is connected in parallel with the variable-capacitance element 5 in the foregoing embodiment 1, the negative capacitance circuit 6 is connected in series with the variable-capacitance element 5 in the present embodiment 2.

To control the oscillation frequency in FIG. 4, varying the control voltage applied to the variable-capacitance element 5 causes the junction capacitance $C_j$ of the variable-capacitance element to vary, thereby changing the resonance frequency of the tuned circuit. Thus, the oscillation frequency varies.

Figure 5:
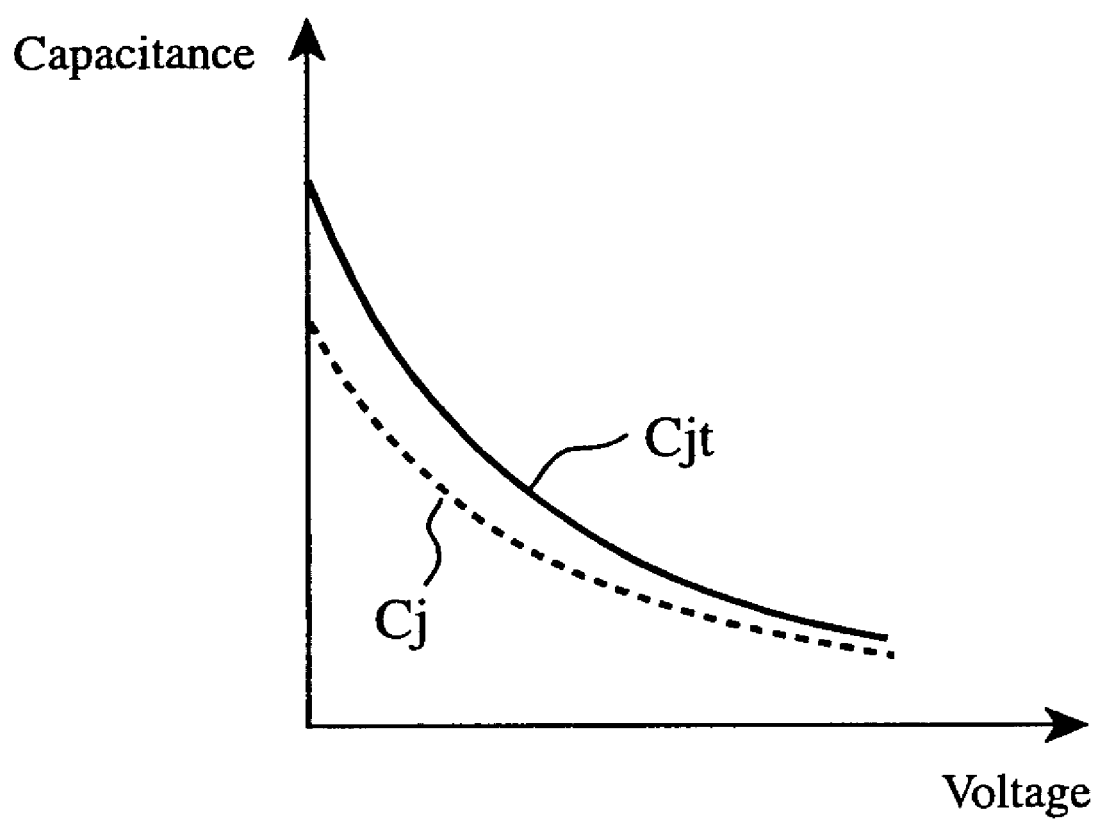
FIG. 5 is a characteristic diagram illustrating variations in the combined capacitance of the variable-capacitance element and negative capacitance circuit of the voltage-controlled oscillator of the embodiment 2 in accordance with the present invention.

FIG. 5 is a characteristic diagram illustrating variations in the combined capacitance of the variable-capacitance element and negative capacitance circuit of the voltage-controlled oscillator of the embodiment 2 in accordance with the present invention. Since the variable-capacitance element 5 is connected in series with the negative capacitance circuit 6 in the present embodiment 2, the maximum value of the junction capacitance $C_j$ of the variable-capacitance element 5 increases with the capacitance $|-C_n|$ of the negative capacitance circuit 6, and the combined capacitance $C_{jt}$ is given by $C_{jt}=C_j C_n/(C_n-C_j)$ (where $C_n>0$) as shown in FIG. 5. The variation ratio of the combined capacitance $C_{jt\_rate}$ is given by the following expression (2), which shows that the variation ratio increases.

$$C_{jt\_rate} = \frac{C_{j\_max}}{C_{j\_min}} \cdot \frac{C_n - C_{j\_min}}{C_n - C_{j\_max}} \quad (C_n - C_{j\_min}) > (C_n - C_{j\_max}), \quad (2)$$

$$C_n > C_{j\_max}$$

As a result, abroad oscillation frequency band is achieved.

As described above, the present embodiment 2 can increase the variation ratio corresponding to the control voltage of the combined capacitance composed of the variable-capacitance element 5 and negative capacitance circuit 6 by connecting the negative capacitance circuit 6 in series with the variable-capacitance element 5, thereby being able to broaden the oscillation frequency band.

Embodiment 3

Figure 6:
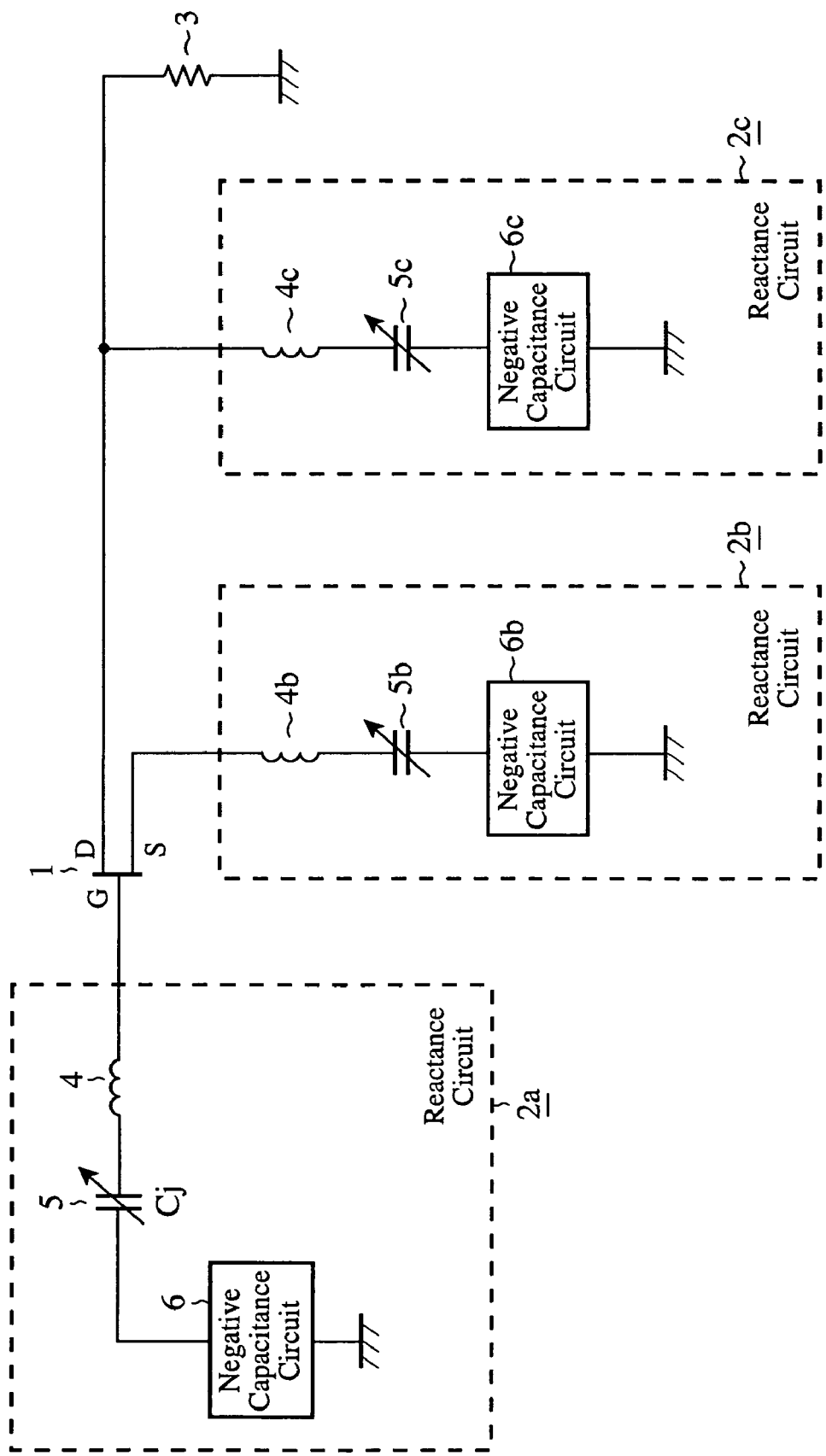
FIG. 6 is a circuit diagram showing a voltage-controlled oscillator of an embodiment 3 in accordance with the present invention.

FIG. 6 is a circuit diagram showing a voltage-controlled oscillator of an embodiment 3 in accordance with the present invention. In FIG. 6, an inductor 4b in the reactance circuit 2b is connected in series with the source terminal of the field-effect transistor 1. A variable-capacitance element 5b, which is composed of a varactor diode or the like, is connected in series with inductor 4b and varies its capacitance in response to the control voltage. A negative capacitance circuit 6b, whose impedance frequency characteristics have opposite characteristics to those of a normal capacitance, is connected in series with the variable-capacitance element 5b. In addition, an inductor 4c in the reactance circuit 2c, which serves as a tuned circuit for controlling the oscillation frequency, is connected in series with the drain terminal of the field-effect transistor 1. A variable-capacitance element 5c, which is composed of a varactor diode or the like, is connected in series with inductor 4c and varies its capacitance in response to the control voltage. A negative capacitance circuit 6c, whose impedance frequency characteristics have opposite characteristics to those of a normal capacitance, is connected in series with the variable-capacitance element 5c. The remaining configuration is the same as that of FIG. 4.

Next, the operation will be described.

The foregoing embodiments 1 and 2 are described by way of example in which only the reactance circuit 2a has the negative capacitance circuit 6 connected to the variable-capacitance element 5. In contrast with this, the present embodiment 3 is configured in such a manner that each of the reactance circuits 2b and 2c has the negative capacitance circuit connected to the variable-capacitance element.

In FIG. 6, the reactance circuit 2a has the negative capacitance circuit 6 connected in series with the variable-capacitance element 5. Accordingly, the capacitance of the negative capacitance circuit 6 increases the maximum value of the junction capacitance of the variable-capacitance element 5, thereby increasing the variation ratio of the combined capacitance. As a result, a broad oscillation frequency band is achieved.

In this case, the reactance circuits 2b and 2c are provided with the variable-capacitance elements 5b and 5c to constitute a tuned circuit. This enables increasing the frequency band that satisfies the oscillation conditions, thereby offering a greater advantage of broadening. In addition, connecting the negative capacitance circuits 6b and 6c to the variable-capacitance elements 5b and 5c brings a still greater advantage of broadening.

As described above, the present embodiment 3 provides the reactance circuits 2b and 2c with the function of the tuned circuit by the variable-capacitance elements 5b and 5c, thereby being able to increase the frequency band satisfying the oscillation conditions, and to further broaden the oscillation frequency band. At the same time, connecting the negative capacitance circuits 6b and 6c to the variable-capacitance elements 5b and 5c makes it possible to increase the variation ratios of the combined capacitances composed of the variable-capacitance elements 5b and 5c and negative capacitance circuits 6b and 6c, which variation ratios correspond to the control voltage, thereby being able to further increase the oscillation frequency band.

Although the foregoing embodiment 3 has a series circuit composed of the inductor, variable-capacitance element and negative capacitance circuit in each of the reactance circuits 2a-2c, the variable-capacitance element and negative capacitance circuit can be configured as a parallel circuit, offering a similar advantage.

In addition, the reactance circuits 2a-2c can be a combination of a series circuit and parallel circuit, which are composed of the inductor, variable-capacitance element and negative capacitance circuit, offering a similar advantage.

Furthermore, the reactance circuits 2a-2c can differ in their configurations. For example, at least one of the reactance circuits 2a-2c can have a variable-capacitance element, and at least one of the single or plurality of the variable-capacitance elements can be connected with a negative capacitance circuit, offering a similar advantage.

Moreover, the reactance circuits 2a-2c can have different combinations of the series circuit and parallel circuit which are composed of the inductor, variable-capacitance element and negative capacitance circuit, offering a similar advantage.

Embodiment 4

Figure 7:
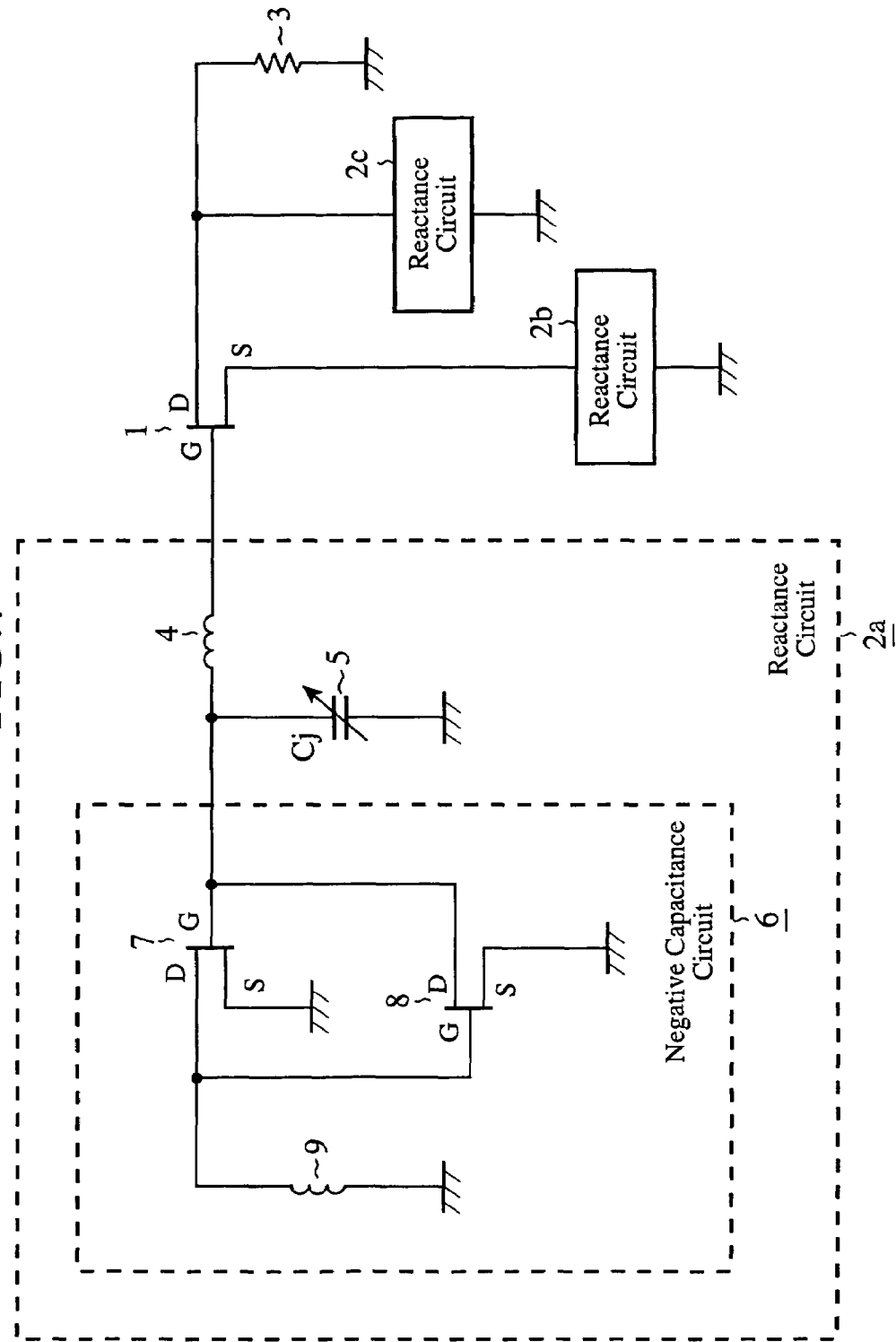
FIG. 7 is a circuit diagram showing a voltage-controlled oscillator of an embodiment 4 in accordance with the present invention.

FIG. 7 is a circuit diagram showing a voltage-controlled oscillator of an embodiment 4 in accordance with the present invention. In FIG. 7, a field-effect transistor (first field-effect transistor) 7 in the negative capacitance circuit 6 has its gate terminal connected in parallel with the variable-capacitance element 5, and has its source terminal grounded. A field-effect transistor (second field-effect transistor) 8 has its drain terminal connected to the gate terminal of the field-effect transistor 7, its source terminal grounded, and its gate terminal connected to the drain terminal of the field-effect transistor 7. An inductor 9 has its first terminal connected to the drain terminal of the field-effect transistor 7, and its second terminal grounded. The remaining configuration is the same as that of FIG. 1.

Next, the operation will be described.

The present embodiment 4 constructs the negative capacitance circuit in the foregoing embodiment 1 from the two field-effect transistors 7 and 8 and the single inductor 9.

The negative capacitance circuit 6 as shown in FIG. 7 has a negative impedance characteristic because a negative current flows when a positive high-frequency voltage is applied to the input. On a Smith chart, characteristics opposite to those of a normal capacitance are obtained with respect to the frequency as shown in FIG. 3.

Although FIG. 7 shows an example in which the negative capacitance circuit 6, which is connected in parallel with the variable-capacitance element in the foregoing embodiment 1, is composed of the two field-effect transistors 7 and 8 and the single inductor 9, it is also applicable to the foregoing embodiment 2.

Figure 8:
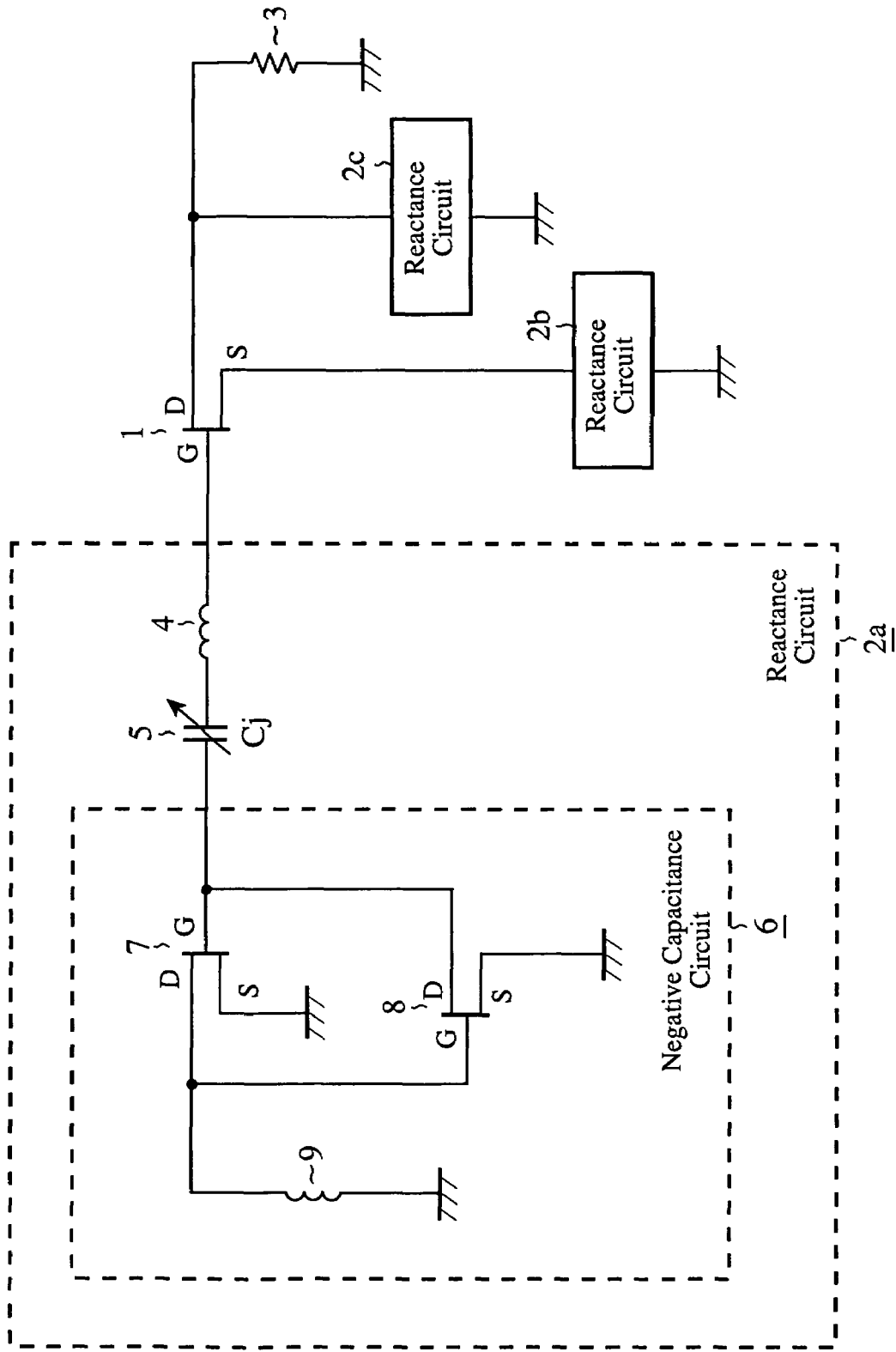
FIG. 8 is a circuit diagram showing another voltage-controlled oscillator of the embodiment 4 in accordance with the present invention.

FIG. 8 is a circuit diagram showing another voltage-controlled oscillator of the embodiment 4 in accordance with the present invention. In FIG. 8, the field-effect transistor 7 in the negative capacitance circuit 6 has its gate terminal connected in series with the variable-capacitance element 5. The remaining configuration is the same as that of FIG. 7.

The configuration has also a negative impedance characteristic because a negative current flows when a positive high-frequency voltage is applied to the input. On a Smith chart, characteristics opposite to those of a normal capacitance are obtained with respect to the frequency as shown in FIG. 3.

As described above, the present embodiment 4 can readily construct the negative capacitance circuit 6 from the two field-effect transistors 7 and 8 and single inductor 9. Thus, connecting the negative capacitance circuit 6 in parallel or in series with the variable-capacitance element 5 makes it possible to increase the variation ratio corresponding to the control voltage of the combined capacitance composed of the variable-capacitance element 5 and negative capacitance circuit 6, thereby being able to broaden the oscillation frequency band.

Embodiment 5

Figure 9:
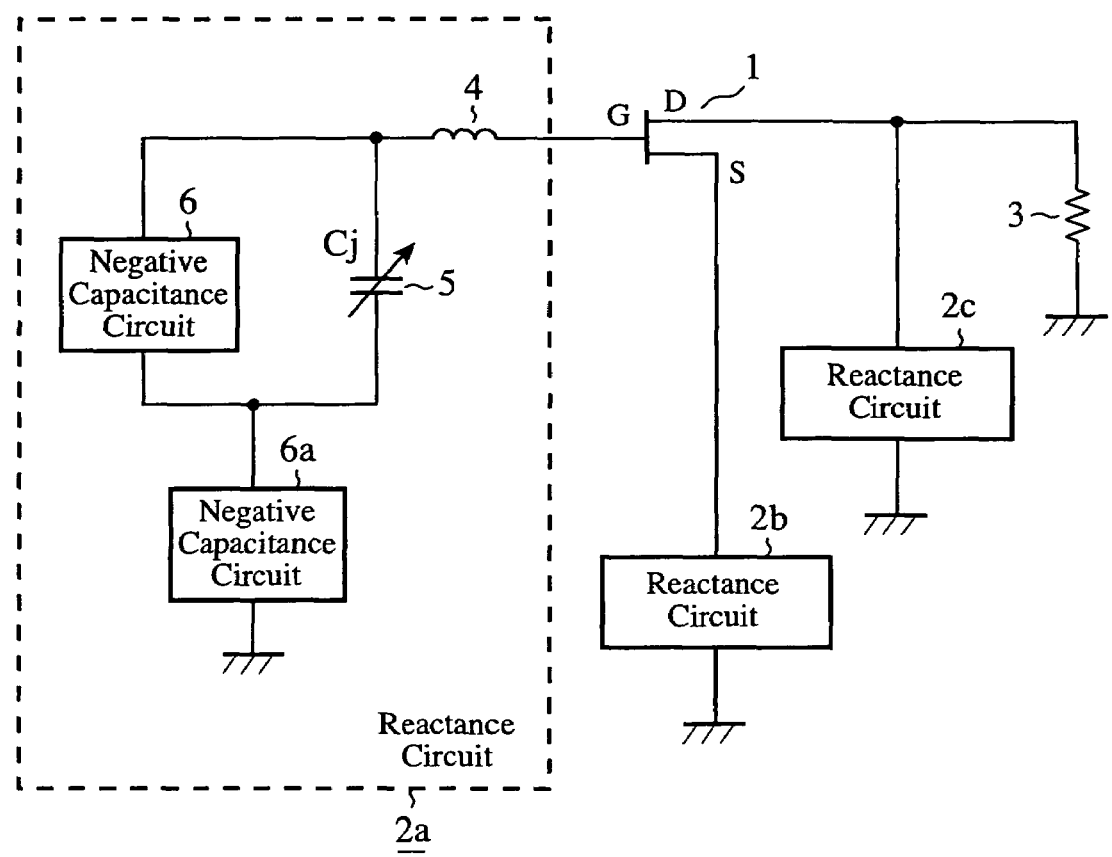
FIG. 9 is a circuit diagram showing a voltage-controlled oscillator of an embodiment 5 in accordance with the present invention.

FIG. 9 is a circuit diagram showing a voltage-controlled oscillator of an embodiment 5 in accordance with the present invention. In FIG. 9, the negative capacitance circuit (first negative capacitance circuit) 6a, whose impedance frequency characteristics have opposite characteristics to those of a normal capacitance, is connected in series with the parallel circuit composed of the variable-capacitance element 5 and negative capacitance circuit 6. The remaining configuration is the same as that of FIG. 1.

Next, the operation will be described.

Although the foregoing embodiment 1 has the negative capacitance circuit 6 connected in parallel with the variable-capacitance element 5, the present embodiment 5 further has the negative capacitance circuit 6a connected in series with the parallel circuit.

In FIG. 9, since the negative capacitance circuit 6 is connected in parallel with the variable-capacitance element 5, the junction capacitance $C_j$ of the variable-capacitance element 5 is reduced by an amount corresponding to the capacitance $|-C_n|$ of the negative capacitance circuit 6. Thus, the variation ratio of the combined capacitance increases.

In addition, since the negative capacitance circuit 6a is connected in series with the parallel circuit, the maximum value of the combined capacitance increases, and the variation ratio of the combined capacitance increases. As a result, a broader oscillation frequency band is achieved.

As described above, the present embodiment 5 has the negative capacitance circuit 6a connected in series with the parallel circuit composed of the variable-capacitance element 5 and negative capacitance circuit 6 as a tuned circuit for controlling the oscillation frequency. As a result, the present embodiment 5 can further increase the variation ratio corresponding to the control voltage of the combined capacitance composed of the variable-capacitance element 5, negative capacitance circuit 6 and negative capacitance circuit 6a, thereby being able to further increase the oscillation frequency band.

Embodiment 6

Figure 10:
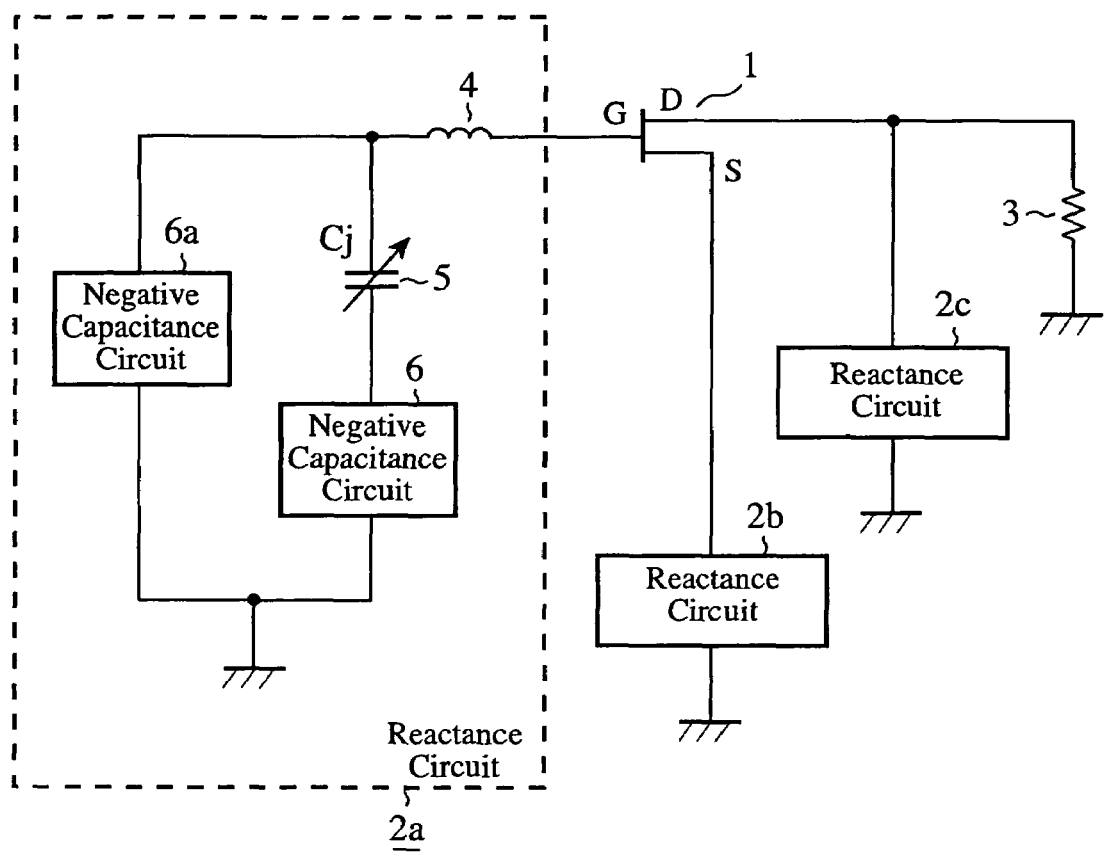
FIG. 10 is a circuit diagram showing a voltage-controlled oscillator of an embodiment 6 in accordance with the present invention.

FIG. 10 is a circuit diagram showing a voltage-controlled oscillator of an embodiment 6 in accordance with the present invention. In FIG. 10, the negative capacitance circuit 6a is connected in parallel with the series circuit composed of the variable-capacitance element 5 and negative capacitance circuit 6. The remaining configuration is the same as that of FIG. 4.

Next, the operation will be described.

Although the foregoing embodiment 2 has the negative capacitance circuit 6 connected in series with the variable-capacitance element 5, the present embodiment 6 has the negative capacitance circuit 6a connected in parallel with the series circuit.

In FIG. 10, the series connection of the variable-capacitance element 5 with the negative capacitance circuit 6 increases the maximum value of the junction capacitance $C_j$ of the variable-capacitance element 5 because of the capacitance $|-C_n|$ of the negative capacitance circuit 6, thereby increasing the variation ratio of the combined capacitance.

In addition, the parallel connection of the negative capacitance circuit 6a with the series circuit reduces the combined capacitance by an amount of the capacitance $|-C_{n-a}|$ of the negative capacitance circuit 6a, thereby increasing the variation ratio of the combined capacitance. As a result, a broader oscillation frequency band is achieved.

As described above, the present embodiment 6 has the negative capacitance circuit 6a connected in parallel with the series circuit composed of the variable-capacitance element 5 and negative capacitance circuit 6 as a tuned circuit for controlling the oscillation frequency. As a result, the present embodiment 6 can further increase the variation ratio corresponding to the control voltage of the combined capacitance composed of the variable-capacitance element 5, negative capacitance circuit 6 and negative capacitance circuit 6a, thereby being able to further increase the oscillation frequency band.

Embodiment 7

Figure 11:
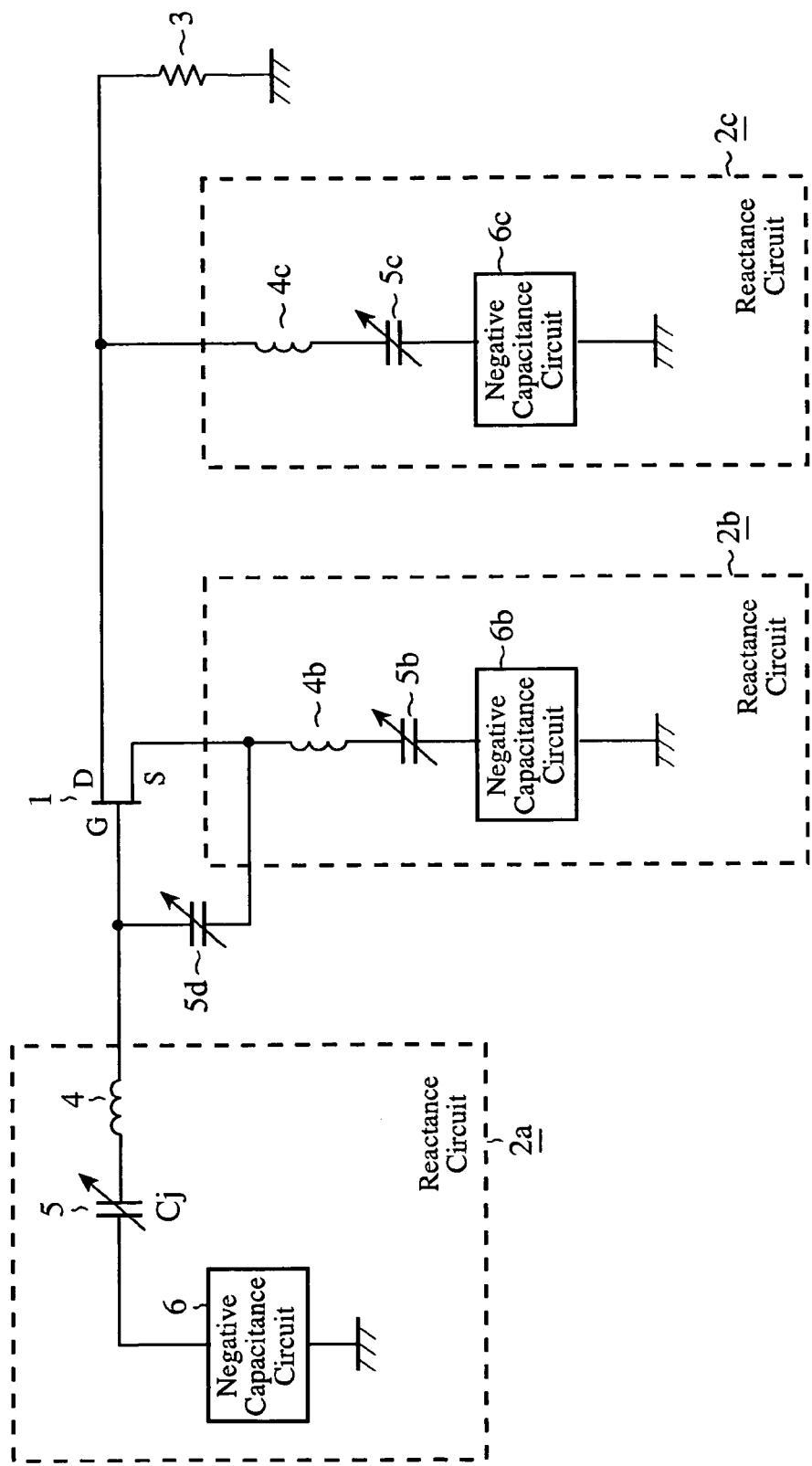
FIG. 11 is a circuit diagram showing a voltage-controlled oscillator of an embodiment 7 in accordance with the present invention.

FIG. 11 is a circuit diagram showing a voltage-controlled oscillator of an embodiment 7 in accordance with the present invention. In FIG. 11, a variable-capacitance element (first variable-capacitance element) 5d, which is connected between the gate terminal and source terminal of the field-effect transistor 1, varies its capacitance in response to the control voltage. The remaining configuration is the same as that of FIG. 6.

Next, the operation will be described.

The foregoing embodiments 1-6 are described by way of example in which the negative capacitance circuit is connected to the variable-capacitance element in the reactance circuits 2a-2c. The present embodiment 7 further includes the variable-capacitance element 5d connected across the gate terminal and source terminal of the field-effect transistor 1.

In FIG. 11, since the negative capacitance circuits are connected in series with the variable-capacitance elements, the maximum values of the junction capacitances of the variable-capacitance elements become greater than the capacitances of the negative capacitance circuits, and the variation ratio of the combined capacitance increases. As a result, a broad oscillation frequency band is achieved.

In this case, connecting the variable-capacitance element 5d across the gate terminal and source terminal of the field-effect transistor 1 can increase the gate-source capacitance $C_{gs}$ in response to the control voltage, thereby offering a greater advantage of broadening the band.

As described above, the present embodiment 7 has a variable-capacitance element 5d which is connected between the gate terminal and source terminal of the field-effect transistor 1, and which varies its capacitance in response to the control voltage. Thus varying the gate-source capacitance of the field-effect transistor 1 in response to the control voltage makes it possible to further increase the oscillation frequency band.

Embodiment 8

Figure 12:
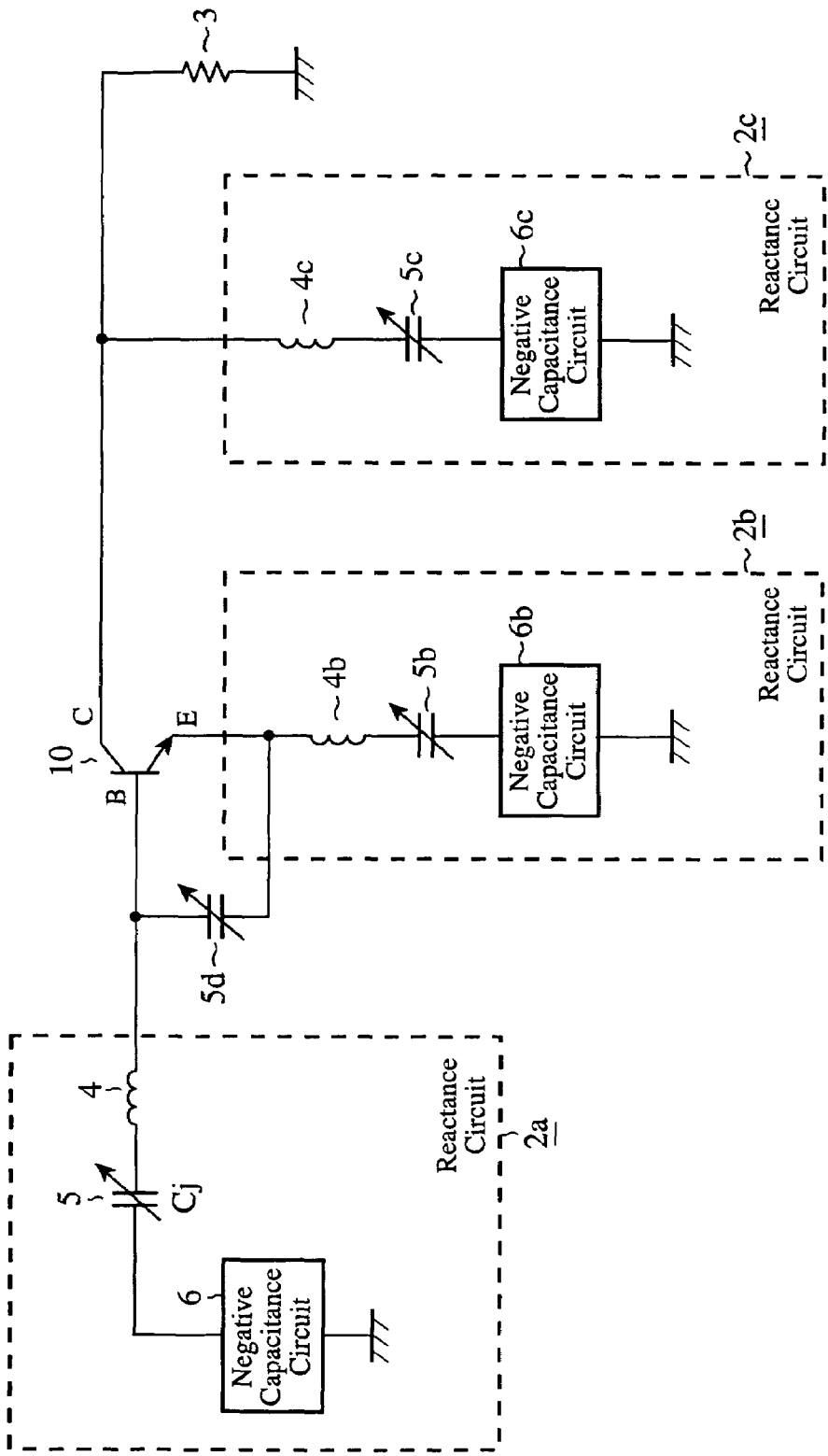
FIG. 12 is a circuit diagram showing a voltage-controlled oscillator of an embodiment 8 in accordance with the present invention.

FIG. 12 is a circuit diagram showing a voltage-controlled oscillator of an embodiment 8 in accordance with the present invention. In FIG. 12, a bipolar transistor 10 operates as an active element for oscillation for amplifying the power within the voltage-controlled oscillator circuit. In addition, the variable-capacitance element 5d, which is connected between the emitter terminal and base terminal of the bipolar transistor 10, varies its capacitance in response to the control voltage. The remaining configuration is the same as that of FIG. 11.

Next, the operation will be described.

Although the foregoing embodiments 1-7 are described by way of example which employs the field-effect transistor 1 as the active element for oscillation, the present embodiment 8 employs the bipolar transistor 10 as the active element for oscillation.

In the voltage-controlled oscillator as shown in FIG. 12, the power within the voltage-controlled oscillator circuit is amplified by the bipolar transistor 10, and part of the amplified power is fed back to the bipolar transistor 10 via the first to third reactance circuits 2a-2c connected to the terminals of the bipolar transistor 10. Thus, the bipolar transistor 10 further amplifies the power, thereby carrying out the oscillation operation and producing the oscillation output from the load resistance 3. The oscillation frequency is determined by the resonance frequency of the tuned circuits. To control the oscillation frequency, varying the control voltage applied to the variable-capacitance elements 5 varies the junction capacitances of the variable-capacitance elements, thereby varying the resonance frequency of the tuned circuits. Thus, the oscillation frequency varies.

In the present embodiment 8, the negative capacitance circuits are connected in series with the variable-capacitance elements. Accordingly the maximum values of the junction capacitances of the variable-capacitance elements increase because of the capacitances of the negative capacitance circuits, thereby increasing the variation ratios of the combined capacitances. As a result, a broad oscillation frequency band is achieved.

In this case, connecting the variable-capacitance element 5d between the emitter terminal and base terminal of the bipolar transistor 10 can increase the emitter-base capacitance $C_j$ of the bipolar transistor 10, which corresponds to the gate-source capacitance $C_{gs}$ of the field-effect transistor 1, in response to the control voltage, thereby expanding the advantage of broadening the band.

As described above, the present embodiment 8 can readily construct the active element for oscillation from the bipolar transistor 10.

In addition, connecting the variable-capacitance element 5d, whose capacitance varies in response to the control voltage, between the emitter terminal and base terminal of the bipolar transistor 10 makes it possible to vary the emitter-base capacitance of the bipolar transistor 10 in response to the control voltage, thereby being able to further increase the oscillation frequency band.

Embodiment 9

Figure 13:
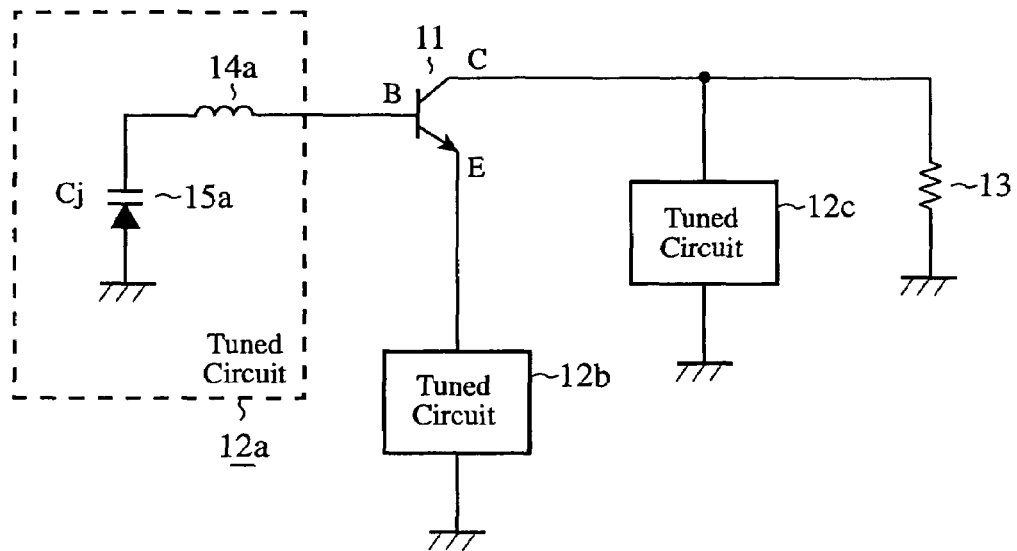
FIG. 13 is a circuit diagram showing a voltage-controlled oscillator of an embodiment 9 in accordance with the present invention.

FIG. 13 is a circuit diagram showing a voltage-controlled oscillator of an embodiment 9 in accordance with the present invention. In FIG. 13, the bipolar transistor 11 operates as an oscillating element for amplifying the power within the voltage-controlled oscillator circuit. A tuned circuit (first tuned circuit) 12a is connected to the base terminal (first terminal) of the bipolar transistor 11; a tuned circuit (second tuned circuit) 12b is connected to the emitter terminal (second terminal) of the bipolar transistor 11; and a tuned circuit (third tuned circuit) 12c is connected to the collector terminal (third terminal) of the bipolar transistor 11. The load resistance 13, which is connected to the tuned circuit 12c, is provided for outputting the oscillation power amplified by the bipolar transistor 11.

An inductor 14a in the tuned circuit 12a is connected in series with the base terminal of the bipolar transistor 11. A variable-capacitance element 15a, which is composed of a varactor diode or the like, is connected in series with the inductor 14a in such a manner that its cathode side is connected to the inductor 14a side, and varies its capacitance in response to the control voltage. In each of the tuned circuits 12b and 12c, the variable-capacitance element and the inductor are assumed to be connected in series in the same manner.

Next, the operation will be described.

In the voltage-controlled oscillator as shown in FIG. 13, the bipolar transistor 11 amplifies the power within the oscillator circuit, and the tuned circuits 12a-12c connected to the individual terminals of the bipolar transistor 11 feed part of the amplified power back to the b-polar transistor 11, and the bipolar transistor 11 further amplifies the power, thereby carrying out the oscillation operation, and causing the load resistance 13 to produce the oscillation output.

Figure 14:
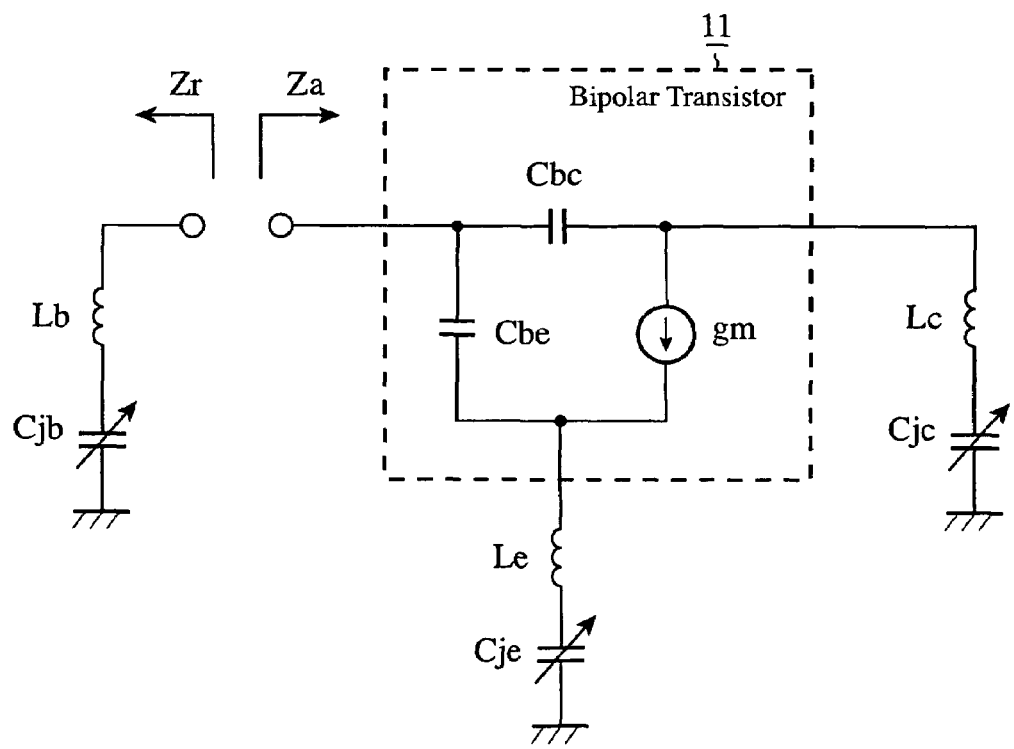
FIG. 14 is a circuit diagram showing an equivalent circuit of the voltage-controlled oscillator of the embodiment 9 in accordance with the present invention.

FIG. 14 is a circuit diagram showing an equivalent circuit of the voltage-controlled oscillator of the embodiment 9 in accordance with the present invention. In FIG. 14, in the bipolar transistor 11, $C_{be}$ is a base-emitter capacitance, $C_{bc}$ is a base-collector capacitance, and gm is a transconductance. The symbol $L_b$ is a base side inductance, $C_{jb}$ is a base side capacitance value, $L_e$ is an emitter side inductance, $C_{je}$ is an emitter side capacitance value, $L_c$ is a collector side inductance, $C_{jc}$ is a collector side capacitance value, $Z_a$ is an impedance seen by looking into the bipolar transistor 11 side from the base terminal, and $Z_r$ is an impedance seen by looking into the inductor 14a side from the base terminal.

The oscillation frequency is a frequency that satisfies the following expressions (3) and (4).

$$Re(Z_a)+Re(Z_r)<0 \quad (3)$$

$$Im(Z_a)+Im(Z_r)=0 \quad (4)$$

To control the oscillation frequency, the junction capacitances of the variable-capacitance elements 15 are varied in such a manner as to satisfy the foregoing expressions (3) and (4) by varying the control voltages applied to the variable-capacitance elements 15. Thus, the oscillation frequency is varied.

In this case, the oscillation frequency has the relationships given by the following expressions (5)-(8).

$$\omega_o^2 = \alpha - \sqrt{\alpha^2 - \beta} \quad (5)$$

$$\alpha = \frac{A_b}{C_{jb}} + \frac{A_c}{C_{jc}} + \frac{A_e}{C_{je}} + \frac{A_{bc}}{C_{bc}} + \frac{A_{be}}{C_{be}} \quad (6)$$

$$\beta = A_H\left(\frac{C_{jb}+C_{jc}+C_{je}}{C_{jb}C_{jc}C_{je}} + \frac{C_{jb}+C_{je}}{C_{be}C_{jb}C_{je}} + \frac{C_{jb}+C_{jc}}{C_{bc}C_{jb}C_{jc}} + \frac{1}{C_{bc}C_{be}}\right) \quad (7)$$

$$\omega_0^2 < \frac{1}{C_{bc}L_e}\left(1 + \frac{C_{be}}{C_{jc}}\right) \quad (8)$$

where $\omega_o$ is the oscillation angular frequency, $A_b$, $A_c$, $A_e$, $A_{bc}$, $A_{be}$ and $A_\beta$ are functions of the inductance.

Figure 15:
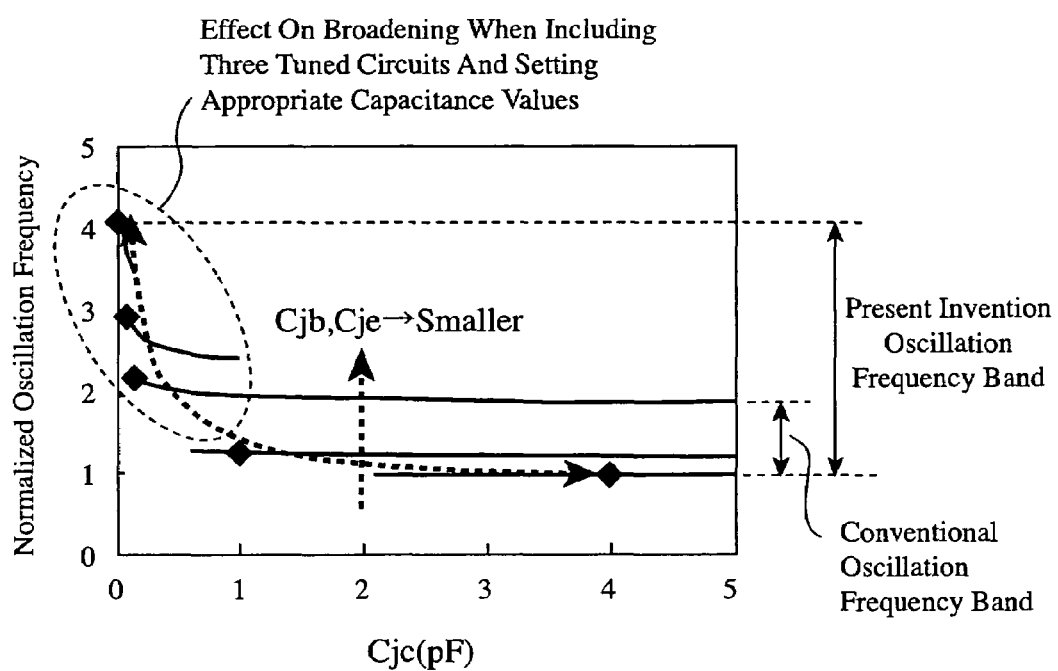
FIG. 15 is a characteristic diagram illustrating the oscillation frequency band of the voltage-controlled oscillator of the embodiment 9 in accordance with the present invention.

FIG. 15 is a characteristic diagram illustrating an oscillation frequency band of the voltage-controlled oscillator of the embodiment 9 in accordance with the present invention. From the foregoing expressions (5)-(8), the relationships between the oscillation frequency and capacitance values $C_{jb}$, $C_{je}$ and $C_{jc}$ become as shown in FIG. 15. It is found from them that the oscillation frequency band can be broadened by providing three tuned circuits, by making the capacitance values and capacitance variation ratios of $C_{jb}$, $C_{je}$ and $C_{jc}$ nearly equal, and by making the capacitance values of $C_{jb}$, $C_{je}$ and $C_{jc}$ nearly equal to or less than the fixed capacitance values $C_{be}$ and $C_{bc}$.

Figure 16:
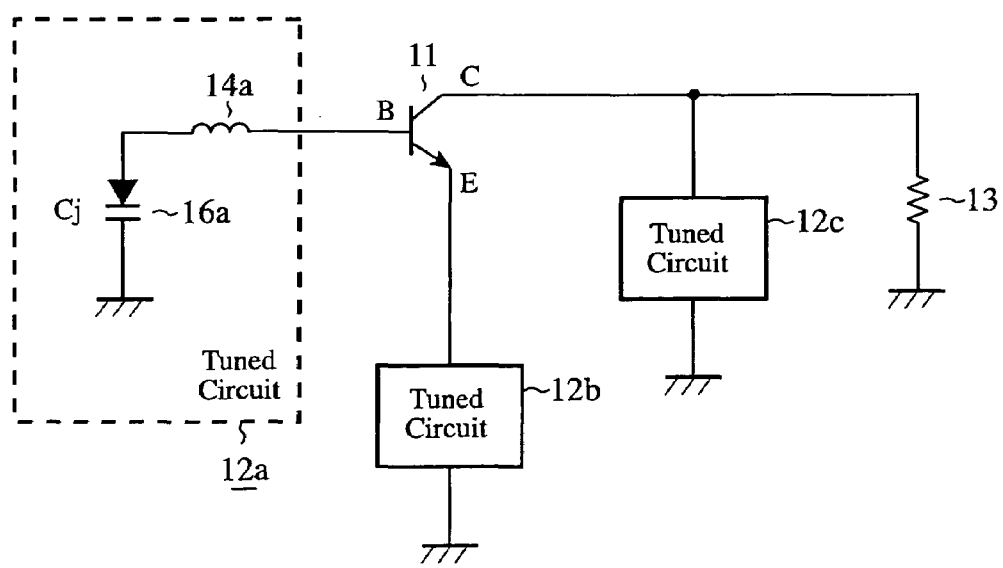
FIG. 16 is a circuit diagram showing another voltage-controlled oscillator of the embodiment 9 in accordance with the present invention.

FIG. 16 is a circuit diagram showing another voltage-controlled oscillator of the embodiment 9 in accordance with the present invention. In FIG. 16, a variable-capacitance element 16a, which is composed of a varactor diode or the like, is connected in series with the inductor 14a in such a manner that its anode side comes into contact with the inductor 14a side, and varies its capacitance in response to the control voltage. The remaining configuration is the same as that of FIG. 13. In this way, the direction of the variable-capacitance element 16a can be reversed, offering a similar advantage.

Figure 17:
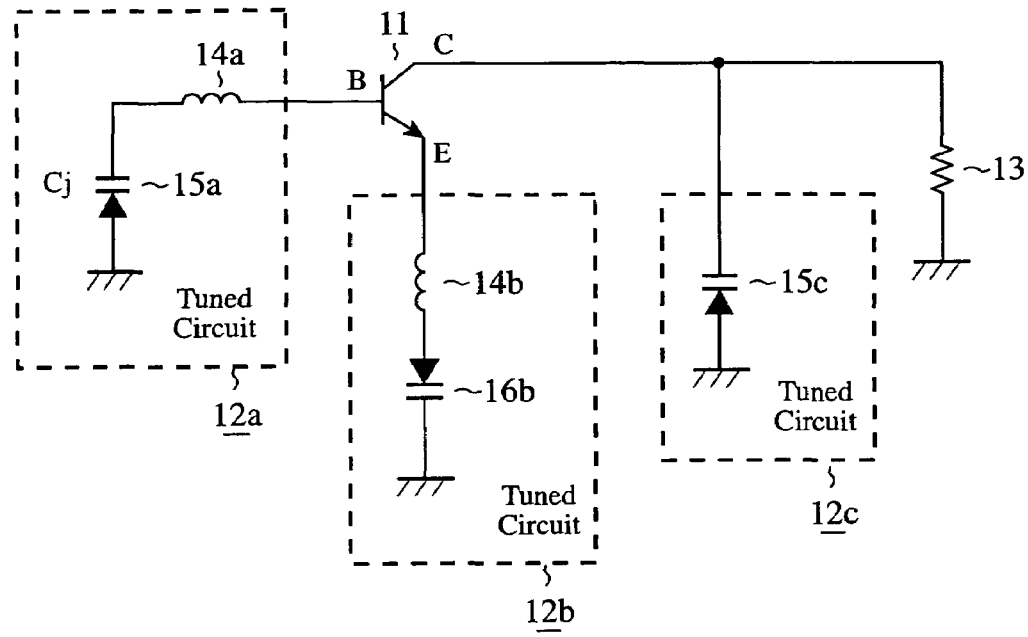
FIG. 17 is a circuit diagram showing still another voltage-controlled oscillator of the embodiment 9 in accordance with the present invention.

FIG. 17 is a circuit diagram showing still another voltage-controlled oscillator of the embodiment 9 in accordance with the present invention. In FIG. 17, an inductor 14b in the tuned circuit 12b is connected in series with the emitter terminal of the bipolar transistor 11. A variable-capacitance element 16b, which is composed of a varactor diode or the like, is connected in series with the inductor 14b in such a manner that its anode side comes into contact with the inductor 14b side, and varies its capacitance in response to the control voltage. A variable-capacitance element 15c in the tuned circuit 12c, which is composed of a varactor diode or the like, is connected in such a manner that its cathode side comes into contact with the collector terminal side, and varies its capacitance in response to the control voltage. The remaining configuration is the same as that of FIG. 13. Thus, not all the tuned circuits 12 require the inductor 14, but it is enough for at least one of the tuned circuits 12 to have the inductor 14, offering a similar advantage.

In addition, the load resistance 13 can be connected to either the tuned circuit 12a or tuned circuit 12b, offering a similar advantage.

Furthermore, although the present embodiment 9 employs the bipolar transistor 11 as the element for oscillation, a field-effect transistor can also be employed, offering a similar advantage.

As described above, the present embodiment 9 can broaden the oscillation frequency band by connecting the tuned circuits 12a-12c to the bipolar transistor 11, and by providing the tuned circuits 12a-12c with the variable-capacitance elements having appropriate capacitance values and capacitance variations.

In addition, connecting the variable-capacitance element and inductor in series can facilitate constructing the tuned circuit.

Furthermore, constructing the active element for oscillation from the bipolar transistor 11 can facilitate constructing the active element for oscillation.

Moreover, constructing the active element for oscillation from the field-effect transistor can facilitate constructing the active element for oscillation.

Embodiment 10

Figure 18:
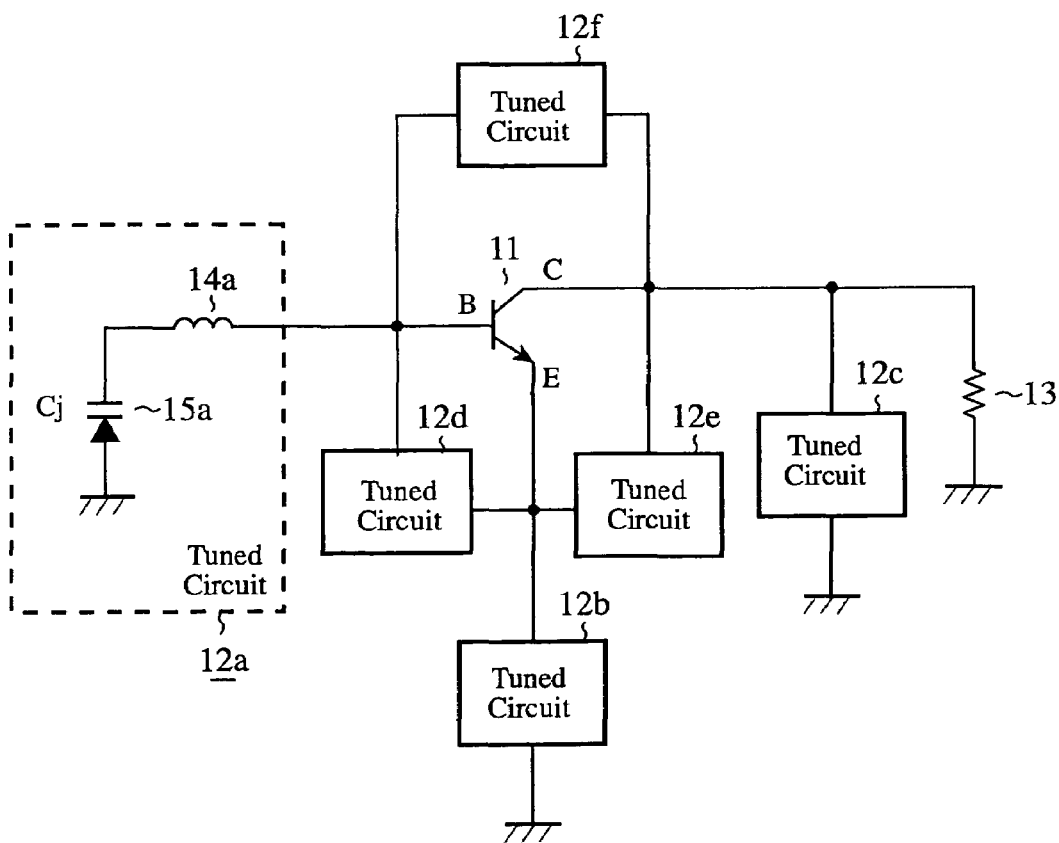
FIG. 18 is a circuit diagram showing a voltage-controlled oscillator of an embodiment 10 in accordance with the present invention.

FIG. 18 is a circuit diagram showing a voltage-controlled oscillator of an embodiment 10 in accordance with the present invention. In FIG. 18, a tuned circuit 12d is connected between the base terminal and emitter terminal of the bipolar transistor 11; a tuned circuit 12e is connected between the emitter terminal and collector terminal of the bipolar transistor 11; and a tuned circuit 12f is connected between the base terminal and collector terminal of the bipolar transistor 11. Here, each of the tuned circuits 12d-12f is assumed to have the variable-capacitance element and inductor connected in series, as well. The remaining configuration is the same as that of FIG. 13.

Next, the operation will be described.

In the voltage-controlled oscillator as shown in FIG. 18, the bipolar transistor 11 amplifies the power within the oscillator circuit, and the tuned circuits 12a-12f connected to the individual terminals of the bipolar transistor 11 feed part of the amplified power back to the bipolar transistor 11, and the bipolar transistor 11 further amplifies the power, thereby carrying out the oscillation operation, and causing the load resistance 13 to produce the oscillation output. The oscillation frequency is the frequency that satisfies the foregoing expressions (3) and (4).

To control the oscillation frequency, the junction capacitances of the variable-capacitance elements 15 are varied in such a manner as to satisfy the foregoing expressions (3) and (4) by varying the control voltages applied to the variable-capacitance elements 15. Thus, the oscillation frequency is varied.

As seen from the foregoing expressions (5)-(8), the oscillation frequency and capacitance values have the relationships. Thus, the oscillation frequency band can be broadened by providing three or more tuned circuits, by making the capacitance values and capacitance variation ratios of the variable-capacitance elements 15 nearly equal, and by making the capacitance values of the variable-capacitance elements 15 nearly equal to or less than the fixed capacitance values.

Figure 19:
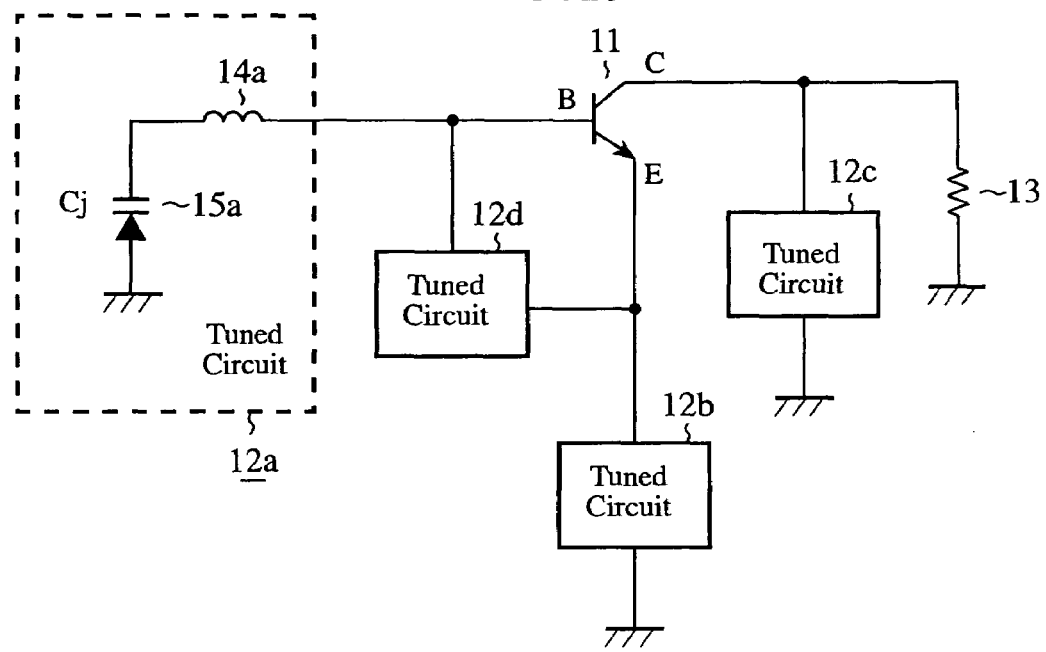
FIG. 19 is a circuit diagram showing another voltage-controlled oscillator of the embodiment 10 in accordance with the present invention.

FIG. 19 is a circuit diagram showing another voltage-controlled oscillator of the embodiment 10 in accordance with the present invention. In FIG. 19, the tuned circuits 12$e$ and 12$f$ as shown in FIG. 18 are eliminated. In this way, it is enough that at least three of the tuned circuits 12$a$-12$f$ of the tuned circuits 12 are provided, offering a similar advantage.

Figure 20:
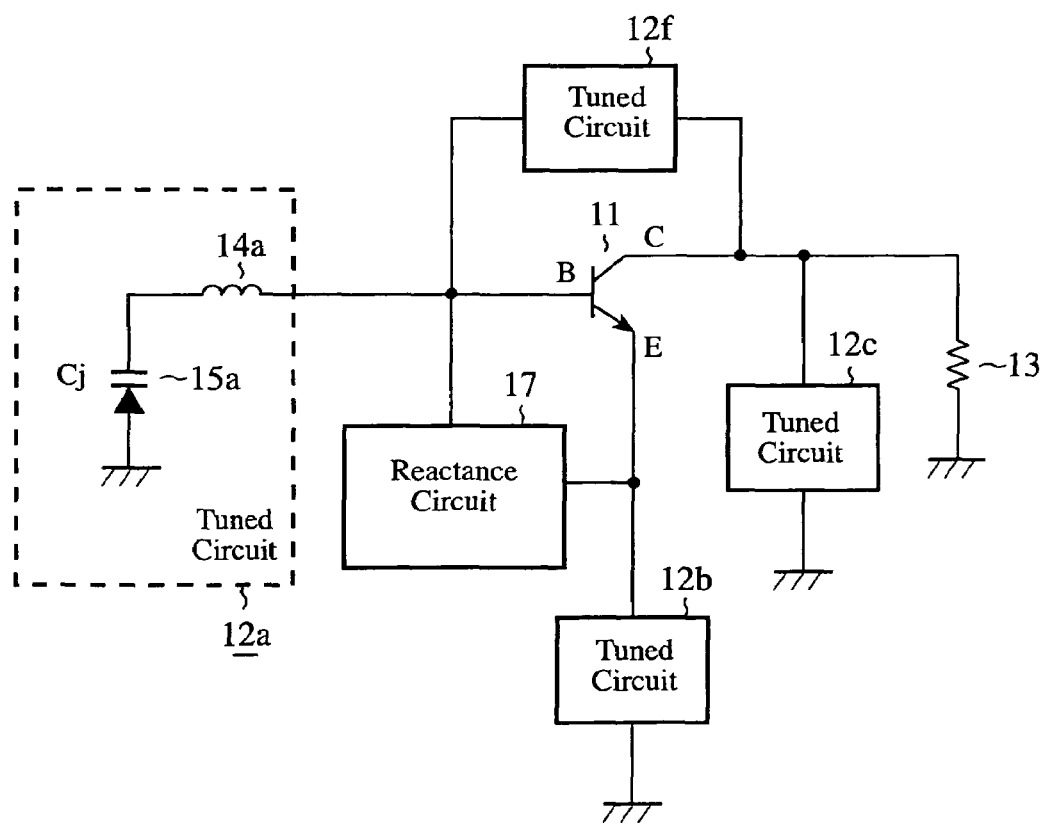
FIG. 20 is a circuit diagram showing still another voltage-controlled oscillator of the embodiment 10 in accordance with the present invention.

FIG. 20 is a circuit diagram showing still another voltage-controlled oscillator of the embodiment 10 in accordance with the present invention. In FIG. 20, a reactance circuit 17 is connected between the base terminal and emitter terminal of the bipolar transistor 11. In this way, a configuration is also possible which has at least three of the tuned circuits 12$a$-12$f$ of the tuned circuits 12, and which has the fixed reactance circuit 17 without the variable-capacitance element 15 connected to at least one location where no tuned circuit 12 is connected. Connecting the reactance circuit 17 can further broaden the oscillation frequency band.

As described above, the present embodiment 10 can broaden the oscillation frequency band by connecting the tuned circuits 12 at least three locations of the base terminal, emitter terminal and collector terminal of the bipolar transistor 11, and between the base terminal and emitter terminal, between the emitter terminal and collector terminal and between the collector terminal and base terminal, and by providing the tuned circuits 12 with the variable-capacitance elements having appropriate capacitance values and capacitance variations. In addition, increasing the number of the tuned circuits 12 connected to four or more can further broaden the oscillation frequency band.

Furthermore, connecting the reactance circuit 17 can further broaden the oscillation frequency band.

Moreover, increasing the number of the reactance circuits 17 to two or more can further broaden the oscillation frequency band.

Embodiment 11

Figure 21:
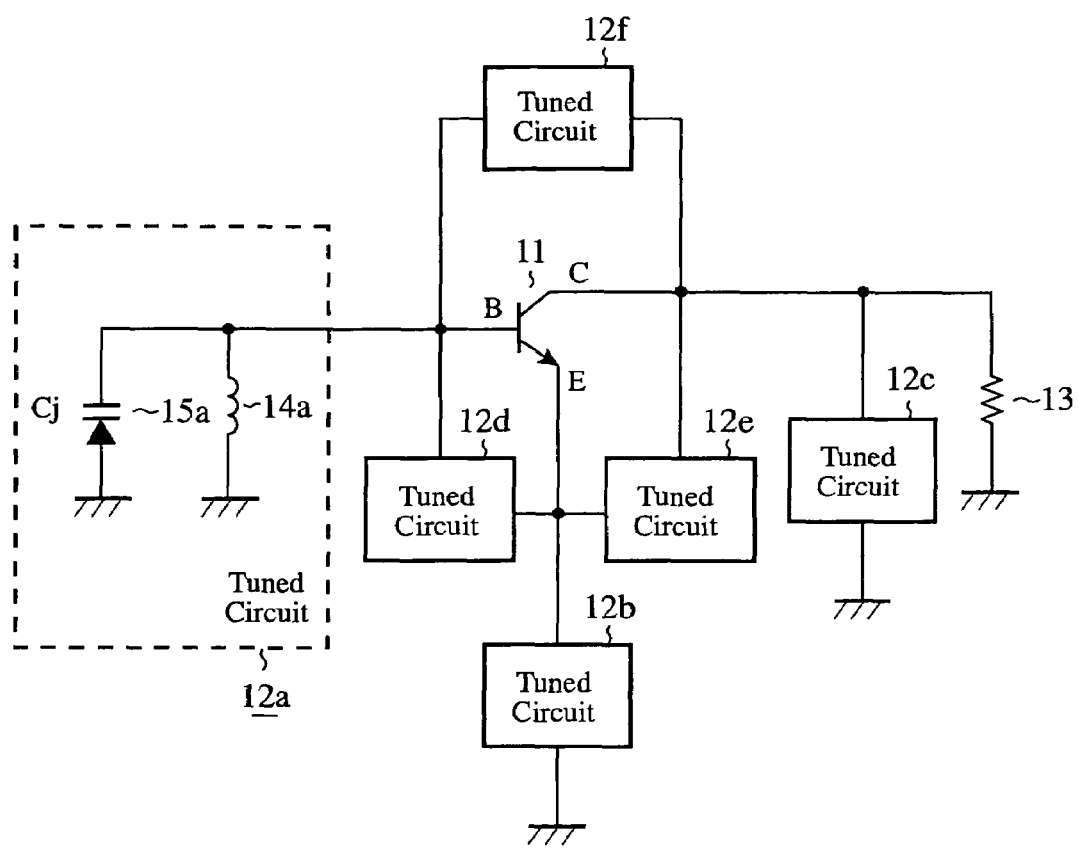
FIG. 21 is a circuit diagram showing a voltage-controlled oscillator of an embodiment 11 in accordance with the present invention.

FIG. 21 is a circuit diagram showing a voltage-controlled oscillator of an embodiment 11 in accordance with the present invention. In FIG. 21, the inductor 14$a$ and variable-capacitance element 15$a$ in the tuned circuit 12$a$ are connected in parallel. The remaining configuration is the same as that of FIG. 18.

Next, the operation will be described.

Although the inductor 14$a$ and variable-capacitance element 15$a$ in the tuned circuit 12$a$ are connected in series in the foregoing embodiments 9 and 10, the inductor 14$a$ and variable-capacitance element 15$a$ in the tuned circuit 12$a$ are connected in parallel in the present embodiment 11.

To control the oscillation frequency in FIG. 21, the junction capacitance of the variable-capacitance element 15 is varied in such a manner as to satisfy the foregoing expressions (3) and (4) by varying the control voltage applied to the variable-capacitance element 15. Thus, the oscillation frequency is varied.

As seen from the foregoing expressions (5)-(8), the oscillation frequency and capacitance values have the relationships. Thus, the oscillation frequency band can be broadened by providing three or more tuned circuits, by making the capacitance values and capacitance variation ratios of the variable-capacitance elements 15 nearly equal, and by making the capacitance values of the variable-capacitance elements 15 nearly equal to or less than the fixed capacitance values.

Figure 22:
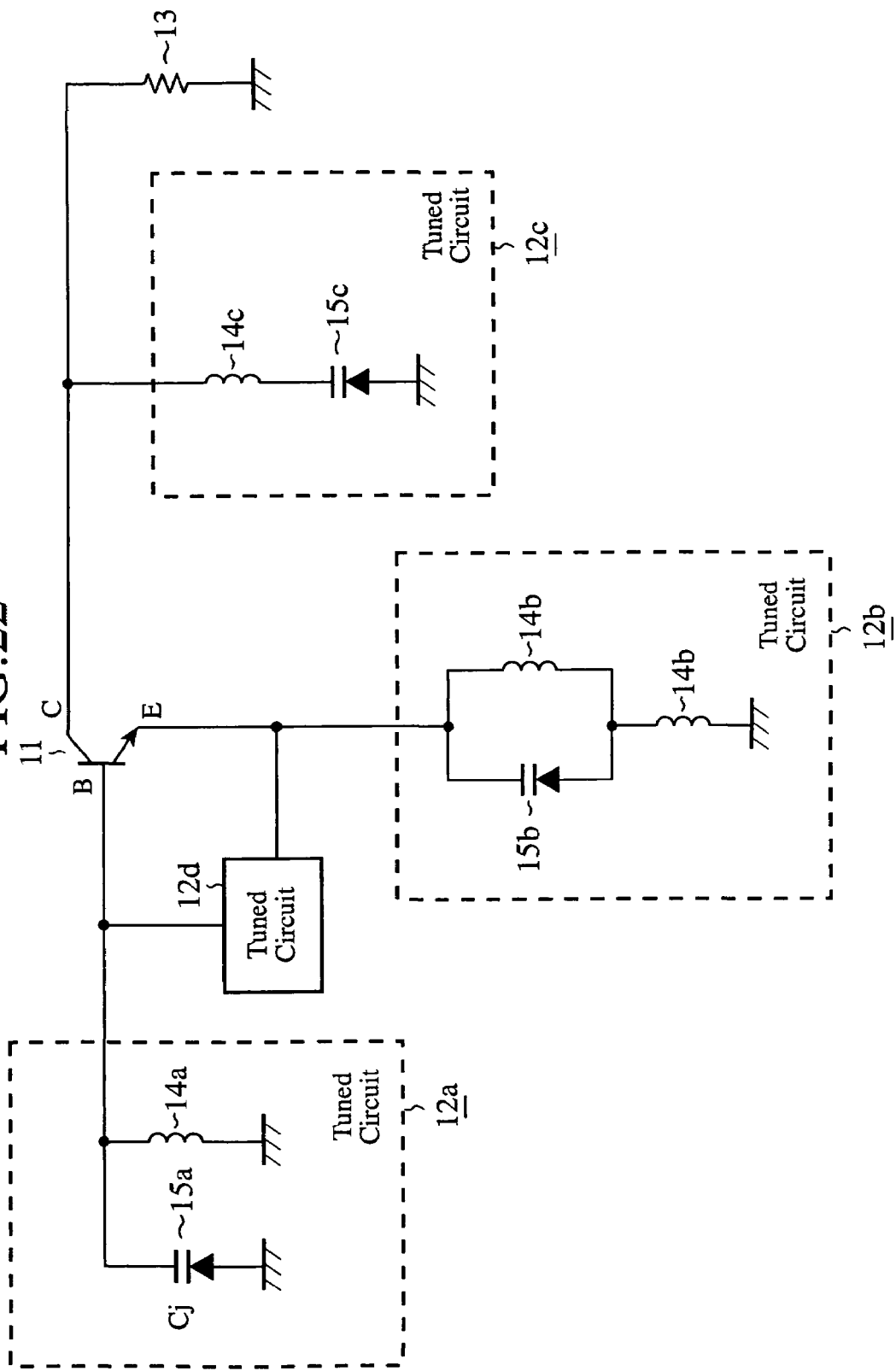
FIG. 22 is a circuit diagram showing another voltage-controlled oscillator of the embodiment 11 in accordance with the present invention.

FIG. 22 is a circuit diagram showing another voltage-controlled oscillator of the embodiment 11 in accordance with the present invention. In FIG. 22, the inductor 14$b$ and variable-capacitance element 15$b$ in the tuned circuit 12$b$ are connected in parallel, and another inductor 14$b$ is connected in series with the parallel circuit. In addition, the inductor 14$c$ and variable-capacitance element 15$c$ in the tuned circuit 12$c$ are connected in series. In this way, the tuned circuits 12 can be a series circuit or parallel circuit of the inductor and variable-capacitance element, or a combination of the series circuit and parallel circuit, offering a similar advantage.

As described above, the present embodiment 11 can facilitate constructing the tuned circuit by connecting the variable-capacitance element and inductor in series.

In addition, the tuned circuit 12 can be a series circuit or parallel circuit of the inductor and variable-capacitance element, or the combination of the two circuits, thereby being able to increase production flexibility.

Embodiment 12

Figure 23:
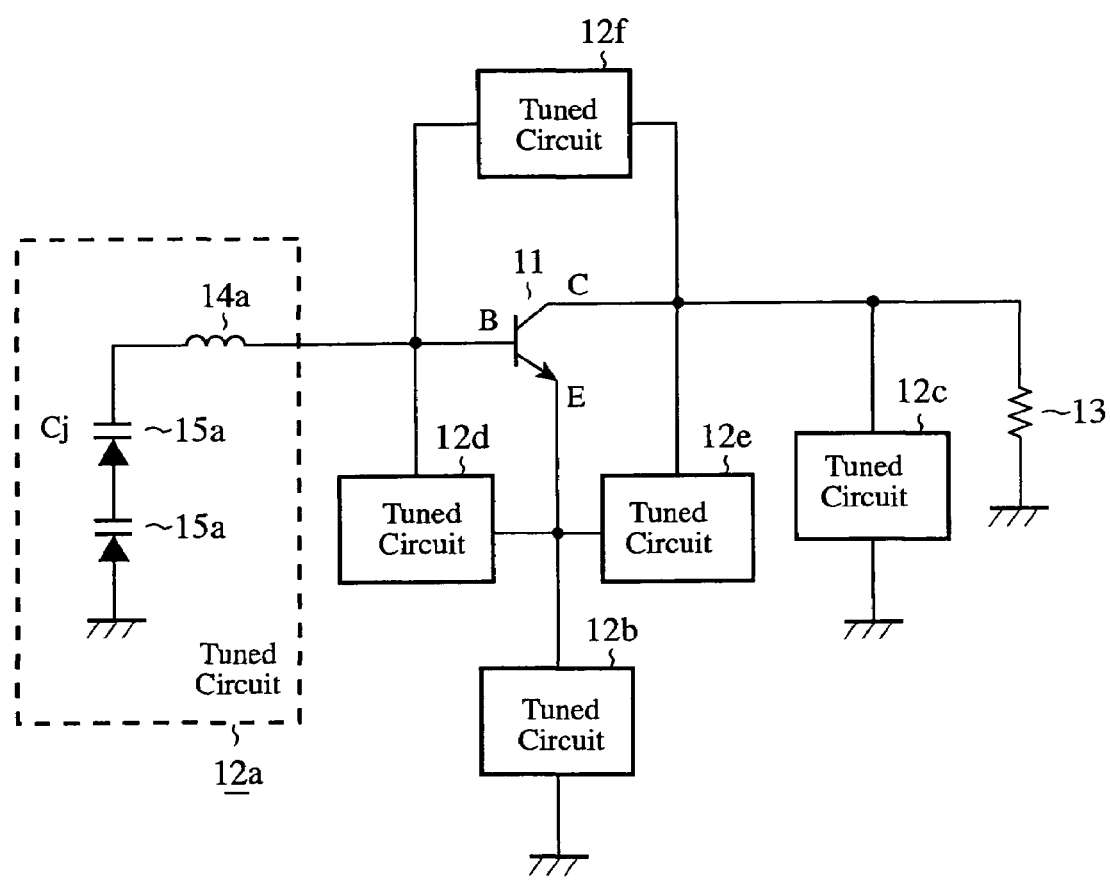
FIG. 23 is a circuit diagram showing a voltage-controlled oscillator of an embodiment 12 in accordance with the present invention.

FIG. 23 is a circuit diagram showing a voltage-controlled oscillator of an embodiment 12 in accordance with the present invention. In FIG. 23, two variable-capacitance elements 15$a$ in the tuned circuit 12$a$, which are composed of varactor diodes, are connected in series in the same direction, and are connected in series with the inductor 14$a$ in such a manner that the cathode side comes into contact with the inductor 14$a$ side. The remaining configuration is the same as that of FIG. 18.

Next, the operation will be described.

Although the tuned circuit 12$a$ includes only one variable-capacitance element 15$a$ in the foregoing embodiment 10, the tuned circuit 12$a$ includes two variable-capacitance elements 15$a$ connected in series in such a manner that the cathode side comes into contact with the inductor 14$a$ side in the present embodiment 12.

To control the oscillation frequency in FIG. 23, the junction capacitance of the variable-capacitance elements 15$a$ and 15$a$ is varied in such a manner as to satisfy the foregoing expressions (3) and (4) by varying the control voltage applied to the variable-capacitance elements 15$a$ and 15$a$. Thus, the oscillation frequency is varied.

As seen from the foregoing expressions (5)-(8), the oscillation frequency band is increased by making the combined capacitance value of the capacitances in the tuned circuit 12 nearly equal to or less than the fixed capacitance value. Thus, connecting the variable-capacitance elements 15$a$ and 15$a$ in series in the same direction can reduce the combined capacitance value to half the capacitance value in the tuned circuit 12, and hence broaden the oscillation frequency band.

In addition, increasing the number of the variable-capacitance elements 15a connected in series can further reduce the capacitance value, thereby being able to broaden the oscillation frequency band.

Figure 24:
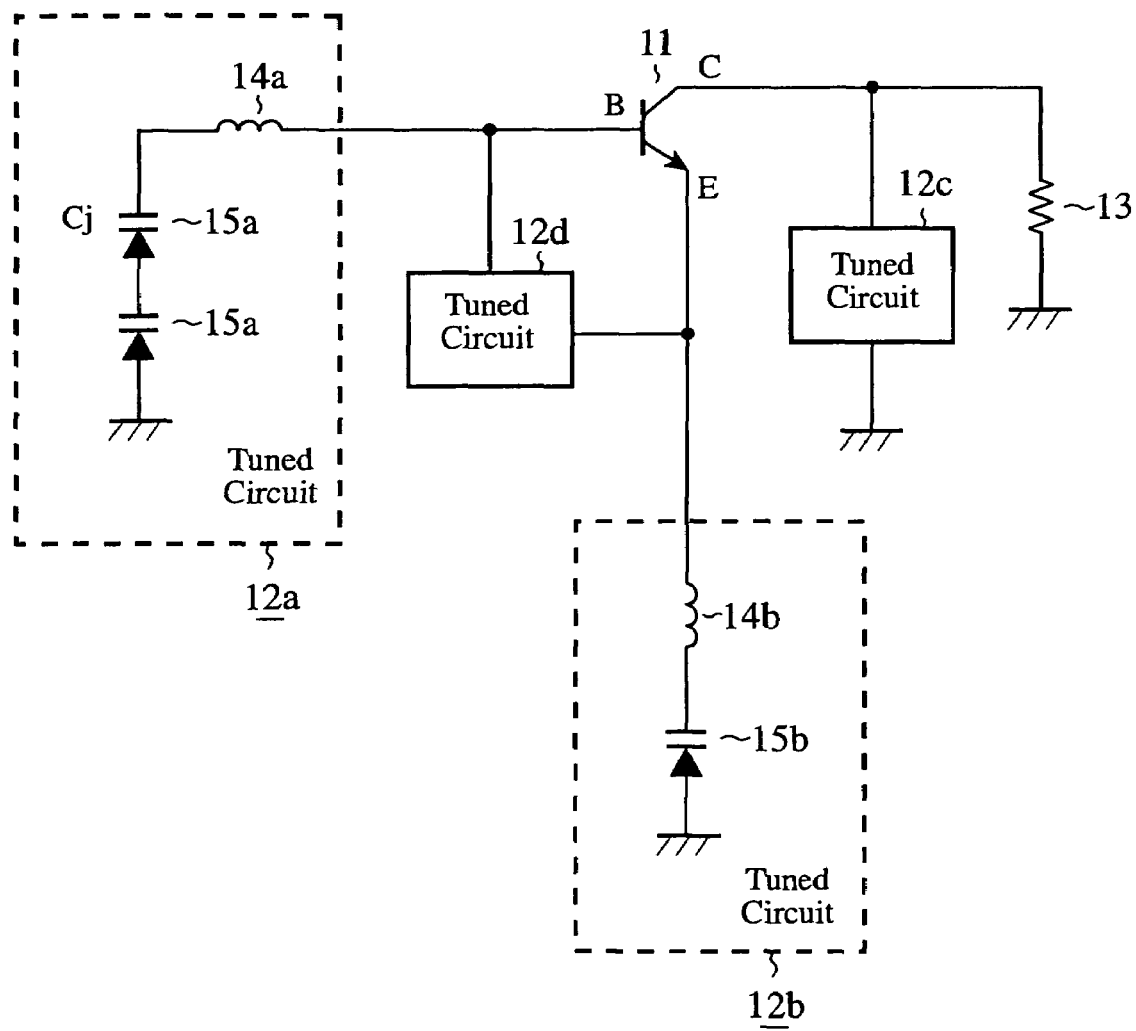
FIG. 24 is a circuit diagram showing another voltage-controlled oscillator of the embodiment 12 in accordance with the present invention.

FIG. 24 is a circuit diagram showing another voltage-controlled oscillator of the embodiment 12 in accordance with the present invention. In FIG. 24, the tuned circuit 12b is constructed by connecting the single variable-capacitance element 15b in series with the inductor 14b. In this way, not all the tuned circuits 12 require the plurality of variable-capacitance elements connected, offering a similar advantage.

As described above, according to the present embodiment 12, the variable-capacitance element is composed of the varactor diodes connected in series in the same direction. Thus, the present embodiment 12 can reduce the capacitance value of the variable-capacitance element, and hence further broaden the oscillation frequency band.

Embodiment 13

Figure 25:
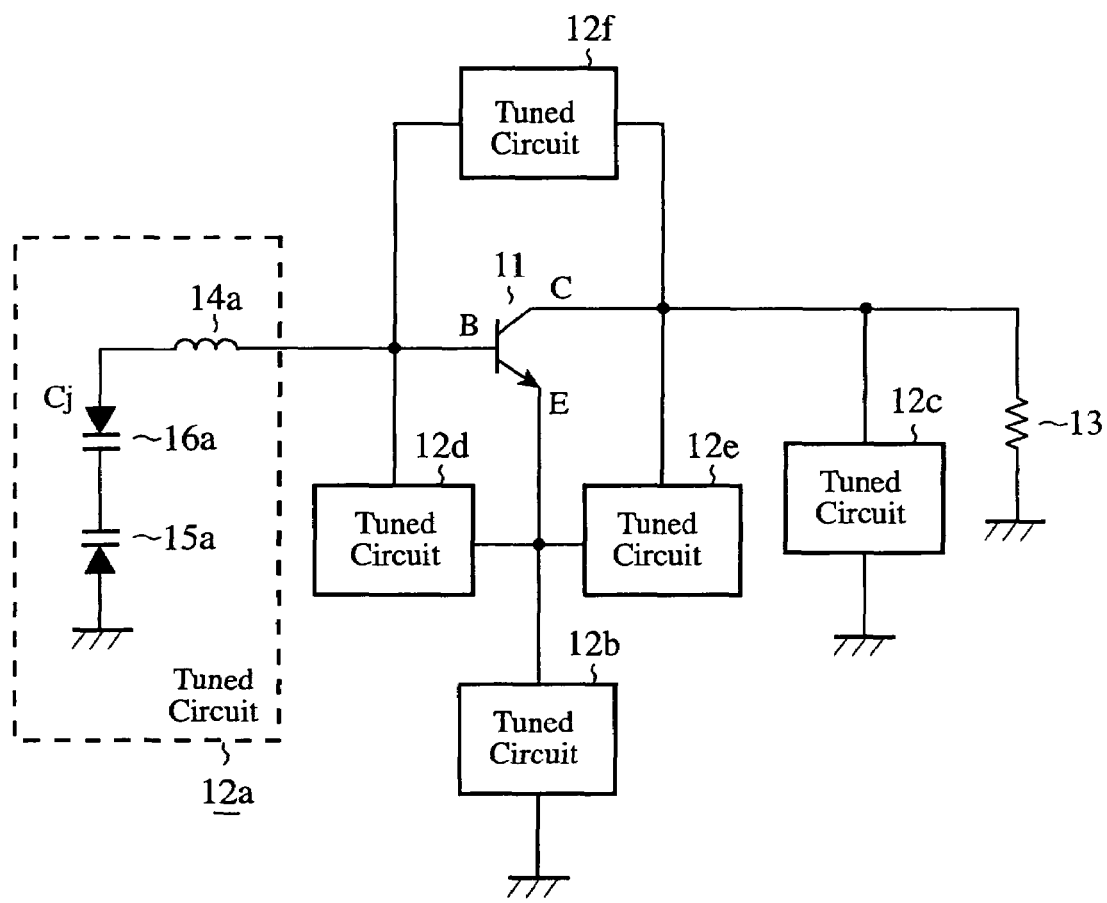
FIG. 25 is a circuit diagram showing a voltage-controlled oscillator of an embodiment 13 in accordance with the present invention.

FIG. 25 is a circuit diagram showing a voltage-controlled oscillator of an embodiment 13 in accordance with the present invention. In FIG. 25, two variable-capacitance elements 15a and 16a in the tuned circuit 12a, which are composed of varactor diodes, have their cathode sides connected in series with each other, and the anode side of one of them is connected in series with the inductor 14a. The remaining configuration is the same as that of FIG. 18.

Next, the operation will be described.

Although the variable-capacitance elements 15a and 15a constituting the tuned circuit 12a are connected in series in the same direction in the foregoing embodiment 12, the variable-capacitance elements 15a and 16a constituting the tuned circuit 12a are connected in series in the opposite direction in the present embodiment 13.

To control the oscillation frequency in FIG. 25, the junction capacitance of the variable-capacitance elements 15a and 16a is varied in such a manner as to satisfy the foregoing expressions (3) and (4) by varying the control voltage applied to the variable-capacitance elements 15a and 16a. Thus, the oscillation frequency is varied.

As seen from the foregoing expressions (5)-(8), the oscillation frequency band is increased by making the combined capacitance value of the capacitances in the tuned circuits 12 nearly equal to or less than the fixed capacitance value. Thus, connecting the variable-capacitance elements 15a and 16a in series in the opposite direction can reduce the combined capacitance value of the capacitance in the tuned circuits 12, and swing the control voltage greatly, thereby being able to broaden the oscillation frequency band.

In addition, increasing the number of the variable-capacitance elements connected in series can further reduce the capacitance value, thereby being able to broaden the oscillation frequency band.

Figure 26:
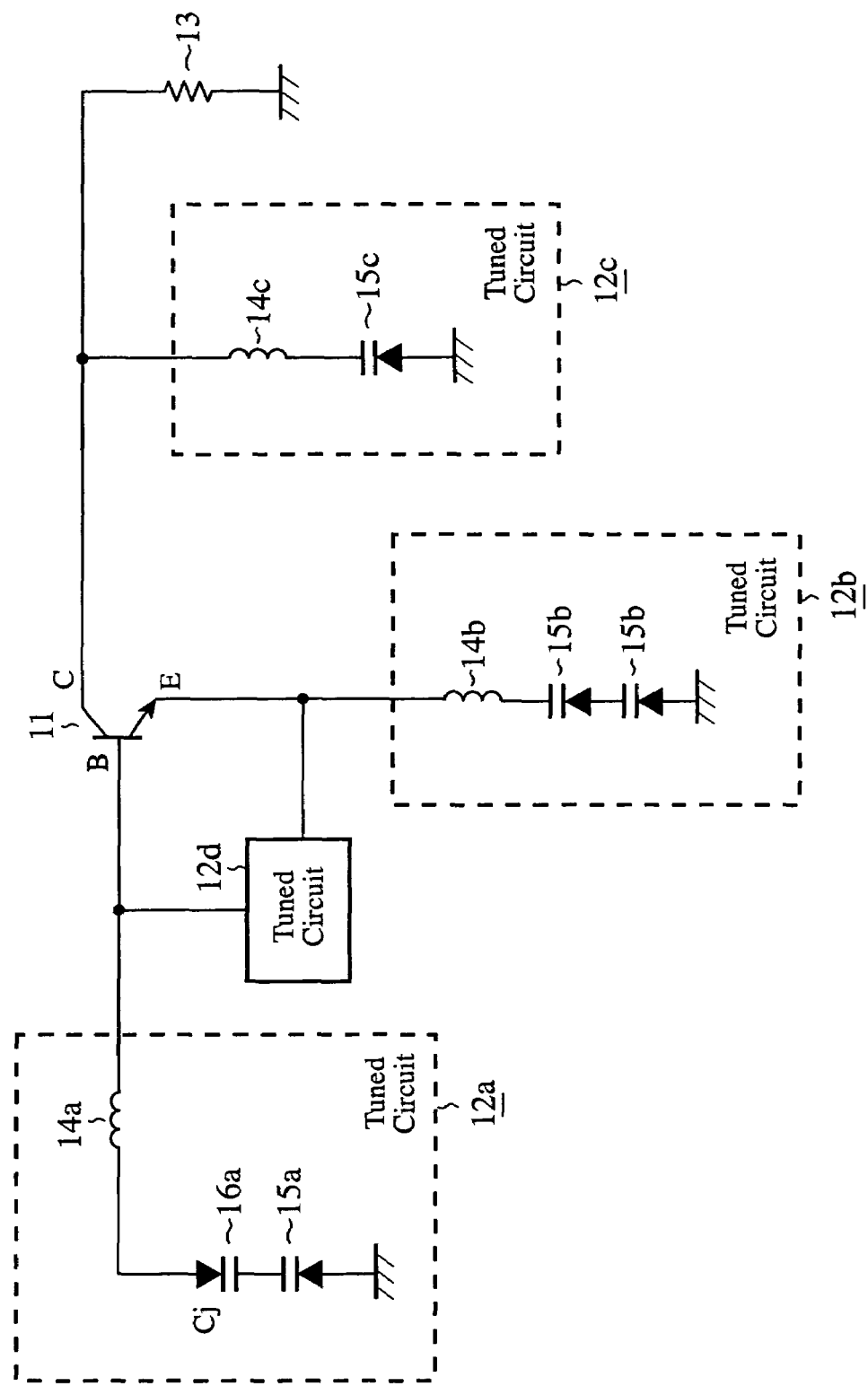
FIG. 26 is a circuit diagram showing another voltage-controlled oscillator of the embodiment 13 in accordance with the present invention.

FIG. 26 is a circuit diagram showing another voltage-controlled oscillator of the embodiment 13 in accordance with the present invention. In FIG. 26, the tuned circuit 12b has two variable-capacitance elements 15b and 15b connected in series in the same direction, and the tuned circuit 12c has a single variable-capacitance element 15c connected in series with the inductor 14c. In this way, not all the tuned circuits 12 require the plurality of variable-capacitance elements connected in the opposite direction, offering a similar advantage.

As described above, according to the present embodiment 13, the variable-capacitance element is composed of the varactor diodes connected in series in the opposite direction. Thus, the present embodiment 13 can reduce the capacitance value of the variable-capacitance element, and hence further broaden the oscillation frequency band.

Embodiment 14

Figure 27:
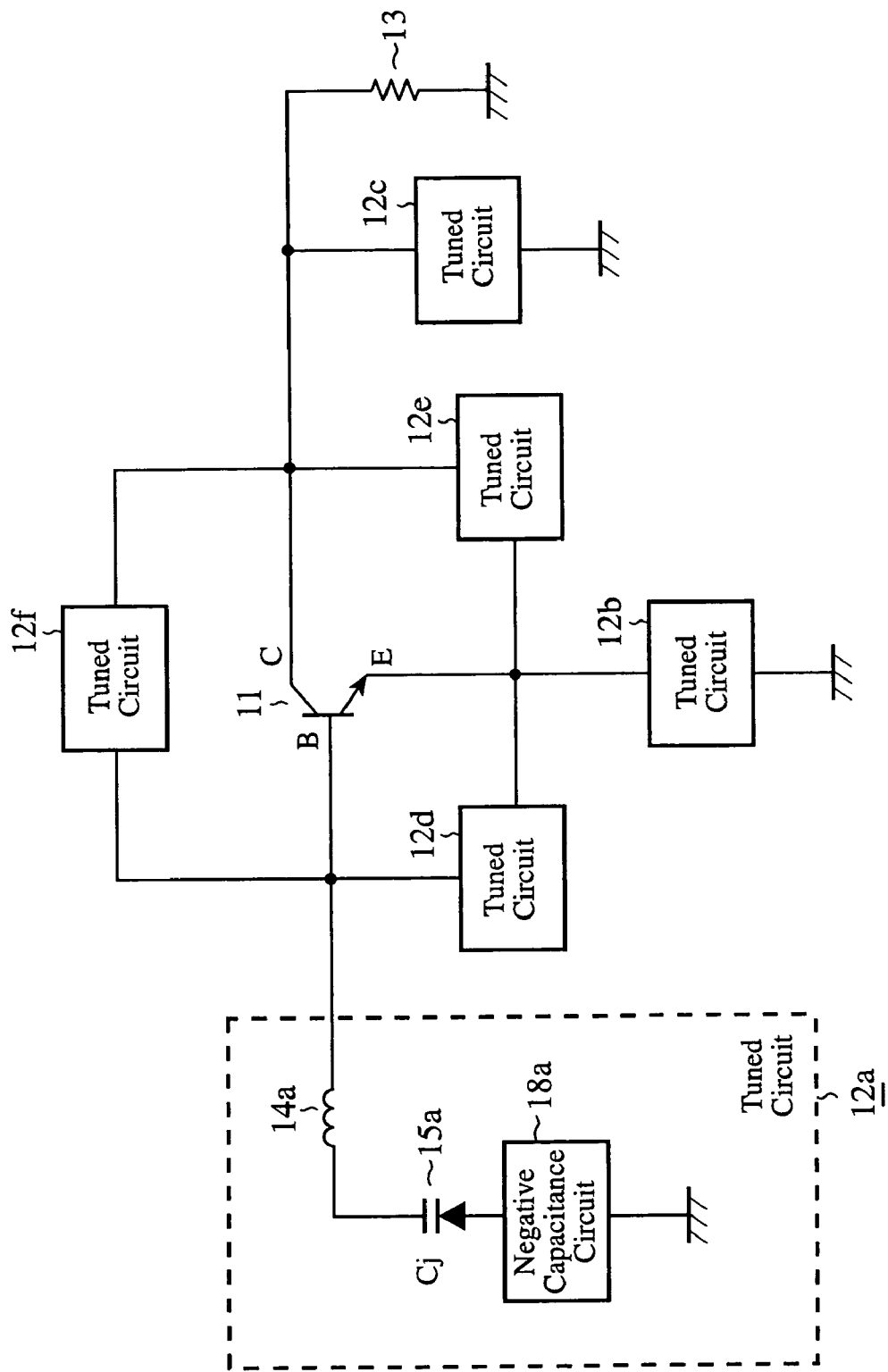
FIG. 27 is a circuit diagram showing a voltage-controlled oscillator of an embodiment 14 in accordance with the present invention.

FIG. 27 is a circuit diagram showing a voltage-controlled oscillator of an embodiment 14 in accordance with the present invention. In FIG. 27, a negative capacitance circuit 18a, whose impedance frequency characteristics have opposite characteristics to those of a normal capacitance, is connected in series with the variable-capacitance element 15a constituting the tuned circuit 12a. The remaining configuration is the same as that of FIG. 18.

Next, the operation will be described.

The foregoing embodiment 10 constructs the tuned circuit 12a from the inductor 14a and variable-capacitance element 15a connected in series. In contrast, the present embodiment 14 constructs the tuned circuit 12a from the variable-capacitance element 15a and negative capacitance circuit 18a connected in series, and the inductor 14a connected in series with them.

To control the oscillation frequency in FIG. 27, the junction capacitance of the variable-capacitance element 15a is varied in such a manner as to satisfy the foregoing expressions (3) and (4) by varying the control voltage applied to the variable-capacitance element 15a. Thus, the oscillation frequency is varied.

It is seen from the foregoing expressions (5)-(8) that the oscillation frequency band is broadened by increasing the variation ratio of the combined capacitance value of the capacitances in the tuned circuit 12.

In this case, since the negative capacitance circuit 18a is connected in series with the variable-capacitance element 15a, the maximum value of the junction capacitance $C_j$ of the variable-capacitance element 15a increases because of the capacitance $|-C_n|$ of the negative capacitance circuit 18a, and the combined capacitance $C_{jt}$ is given by $C_{jt} = C_j C_n / (C_n - C_j)$ (where $C_n > 0$). The variation ratio $C_{jt-rate}$ of the combined capacitance is given by the foregoing expression (2), which indicates an increase of the variation ratio.

As a result, a broad oscillation frequency band is achieved.

As shown in the Smith chart in FIG. 3, the negative capacitance circuit 18a has the direction opposite to that of the normal capacitance with respect to the frequencies on the Smith chart.

Figure 28:
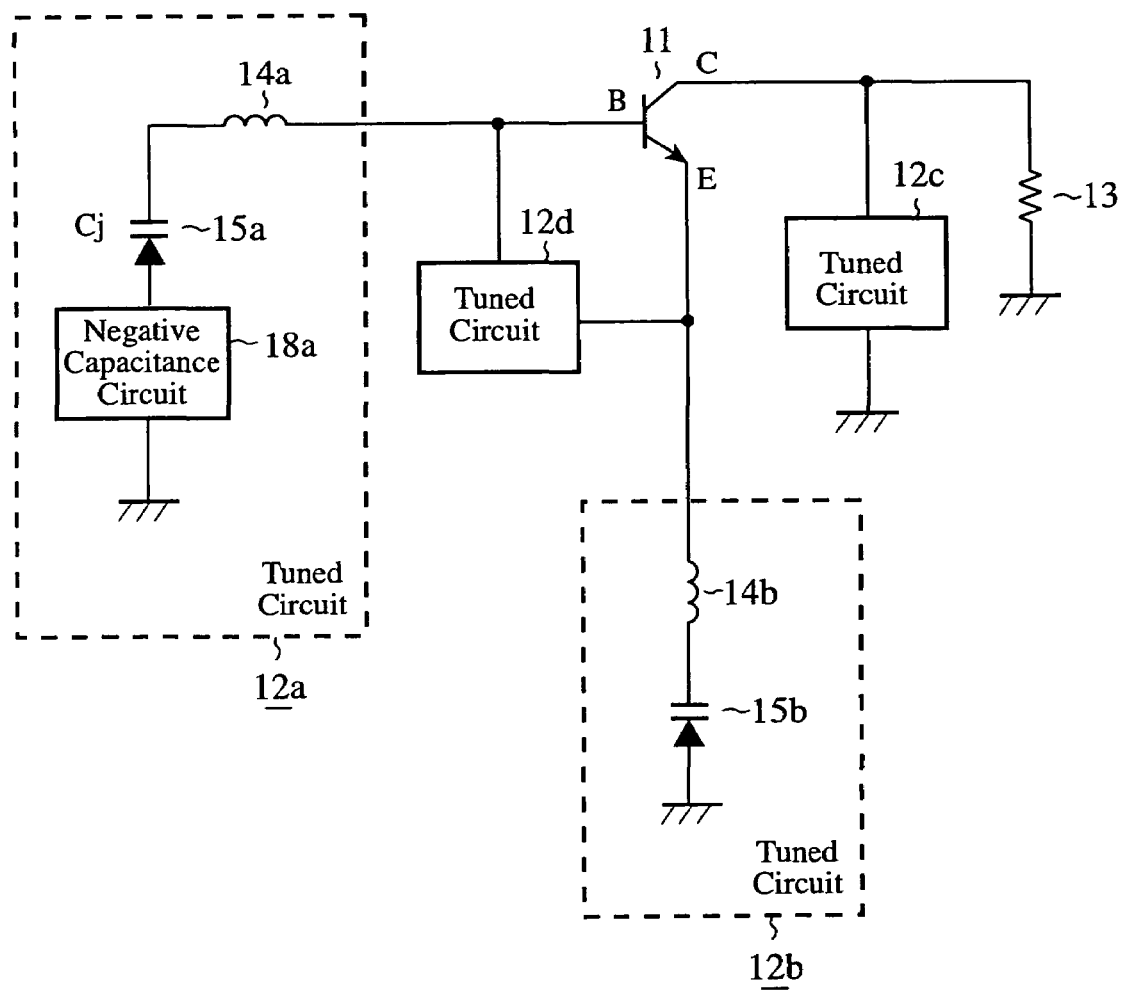
FIG. 28 is a circuit diagram showing another voltage-controlled oscillator of the embodiment 14 in accordance with the present invention.

FIG. 28 is a circuit diagram showing another voltage-controlled oscillator of the embodiment 4 in accordance with the present invention. In FIG. 28, the tuned circuit 12b is constructed by connecting the single variable-capacitance element 15b in series with the inductor 14b. In this way, not all the tuned circuits 12 require the negative capacitance circuit connected, offering a similar advantage.

Figure 29:
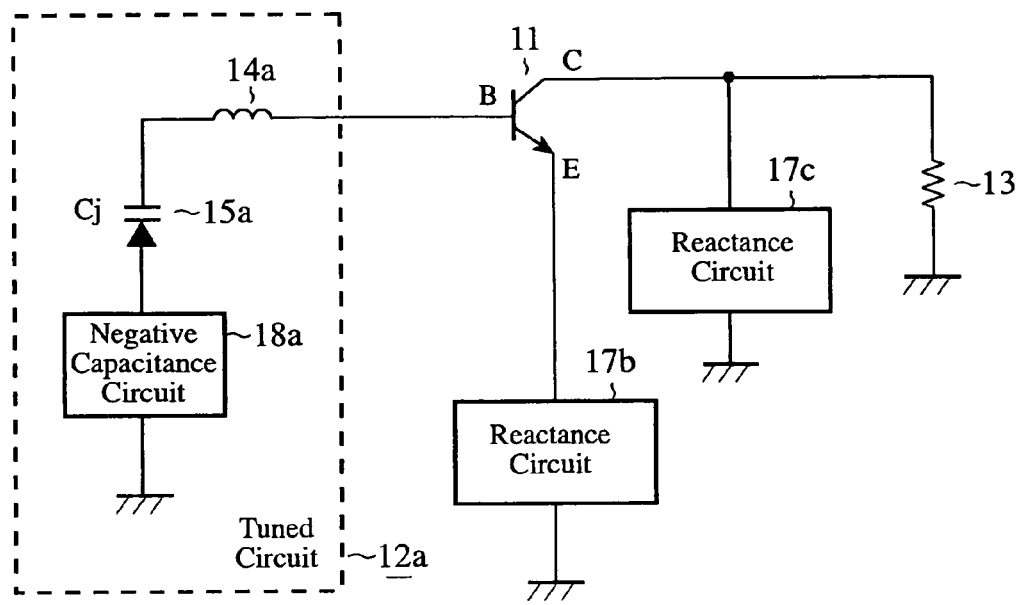
FIG. 29 is a circuit diagram showing still another voltage-controlled oscillator of the embodiment 14 in accordance with the present invention.

FIG. 29 is a circuit diagram showing still another voltage-controlled oscillator of the embodiment 14 in accordance with the present invention. In FIG. 29, a reactance circuit 17b is connected to the emitter terminal of the bipolar transistor 11, and a reactance circuit 17c is connected to the collector terminal of the bipolar transistor 11. In this way, part of the tuned circuits 12 can be composed of a fixed reactance circuit without including the variable-capacitance element 15.

Figure 30:
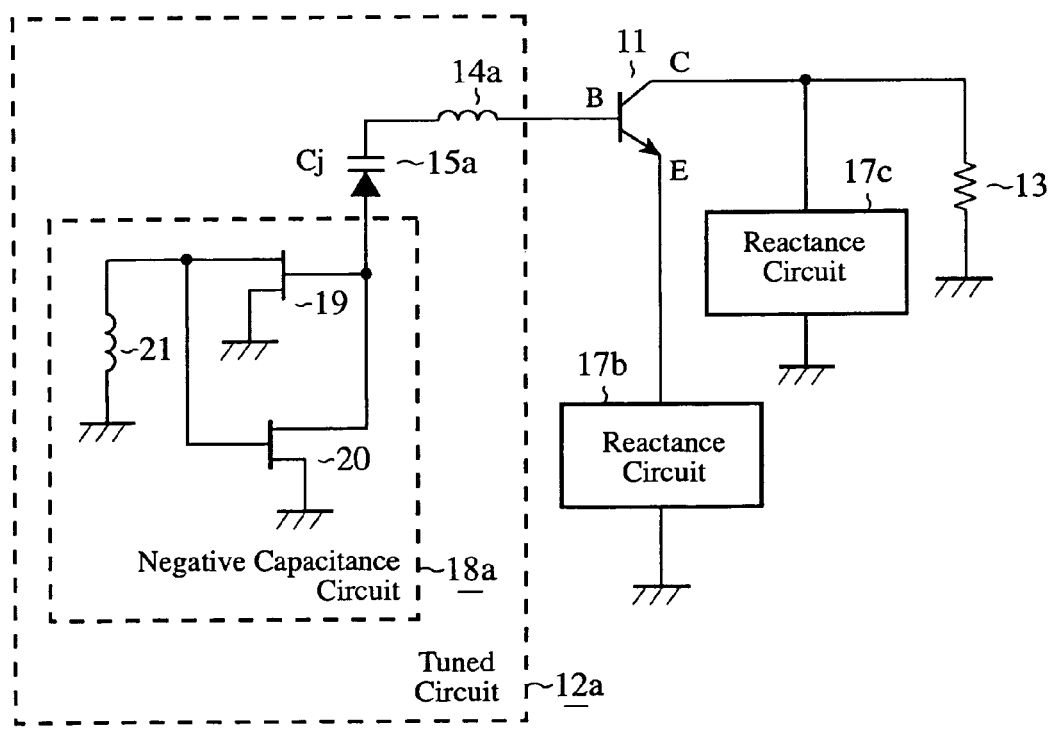
FIG. 30 is a circuit diagram showing another voltage-controlled oscillator of the embodiment 14 in accordance with the present invention.

FIG. 30 is a circuit diagram showing still another voltage-controlled oscillator of the embodiment 14 in accordance with the present invention. In FIG. 30, a field-effect transistor 19 in the negative capacitance circuit 18a has its gate terminal connected in series with the anode of the variable-capacitance element 15a, and its source terminal connected to the ground.

A field-effect transistor 20 has its drain terminal connected to the gate terminal of the field-effect transistor 19, its source terminal grounded, and its gate terminal connected to the drain terminal of the field-effect transistor 19. An inductor 21 has its first terminal connected to the drain terminal of the field-effect transistor 19, and its second terminal grounded. The remaining configuration is the same as that of FIG. 29. Thus, the negative capacitance circuit 18a can be configured easily.

As described above, the present embodiment 14 constructs the tuned circuit 12 from the negative capacitance circuit 18 connected in series with the variable-capacitance element 15. As a result, the present embodiment 14 can increase the variation ratio corresponding to the control voltage of the combined capacitance composed of the variable-capacitance element 15 and negative capacitance circuit 18, thereby being able to further broaden the oscillation frequency band.

Embodiment 15

Figure 31:
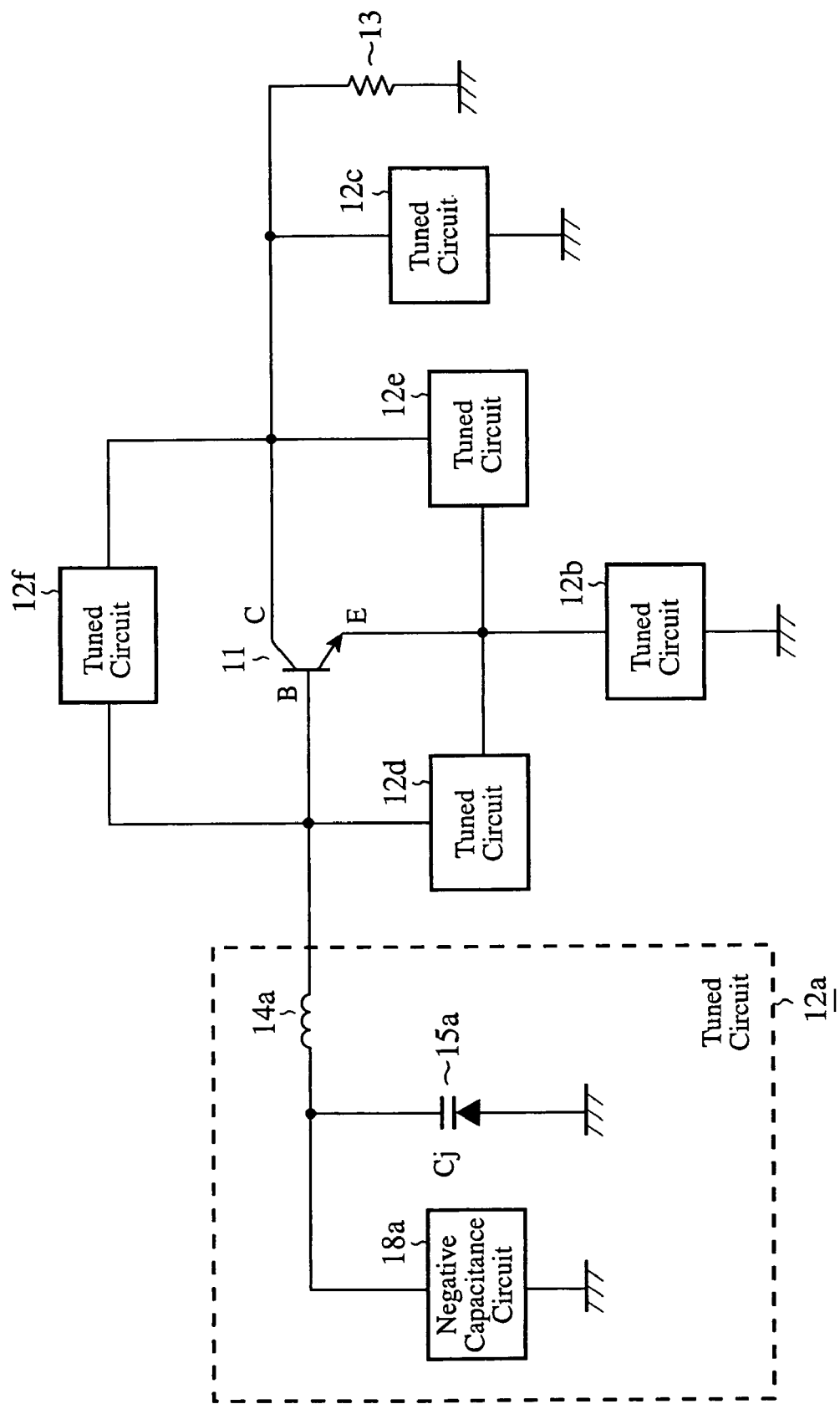
FIG. 31 is a circuit diagram showing a voltage-controlled oscillator of an embodiment 15 in accordance with the present invention.

FIG. 31 is a circuit diagram showing a voltage-controlled oscillator of an embodiment 15 in accordance with the present invention. In FIG. 31, the negative capacitance circuit 18a, whose impedance frequency characteristics have opposite characteristics to those of a normal capacitance, is connected in parallel with the variable-capacitance element 15a constituting the tuned circuit 12a. The remaining configuration is the same as that of FIG. 18.

Next, the operation will be described.

The foregoing embodiment 14 has the negative capacitance circuit 18a connected in series with the variable-capacitance element 15a constituting the tuned circuit 12a. In contrast, the present embodiment 15 has the negative capacitance circuit 18a connected in parallel with the variable-capacitance element 15a constituting the tuned circuit 12a, and has the inductor 14a connected in series with them.

To control the oscillation frequency in FIG. 31, the junction capacitance of the variable-capacitance element 15a is varied in such a manner as to satisfy the foregoing expressions (3) and (4) by varying the control voltage applied to the variable-capacitance element 15a. Thus, the oscillation frequency is varied.

It is seen from the foregoing expressions (5)-(8) that the oscillation frequency band is broadened by making the combined capacitance value of the capacitance in the tuned circuit 12a nearly equal to or less than the fixed capacitance value, or by increasing the capacitance variation ratio.

In this case, since the negative capacitance circuit 18a is connected in parallel with the variable-capacitance element 15a, the junction capacitance $C_j$ of the variable-capacitance element 15a decreases by the capacitance $|-C_n|$ of the negative capacitance circuit 18a, and the combined capacitance $C_{jt}$ is given by $C_{jt}=C_j-C_n$ (where $C_n>0$). On the other hand, the variation ratio $C_{jt\text{-}rate}$ of the combined capacitance is given by the foregoing expression (1), which indicates an increase of the variation ratio.

As a result, a broad oscillation frequency band is achieved.

Figure 32:
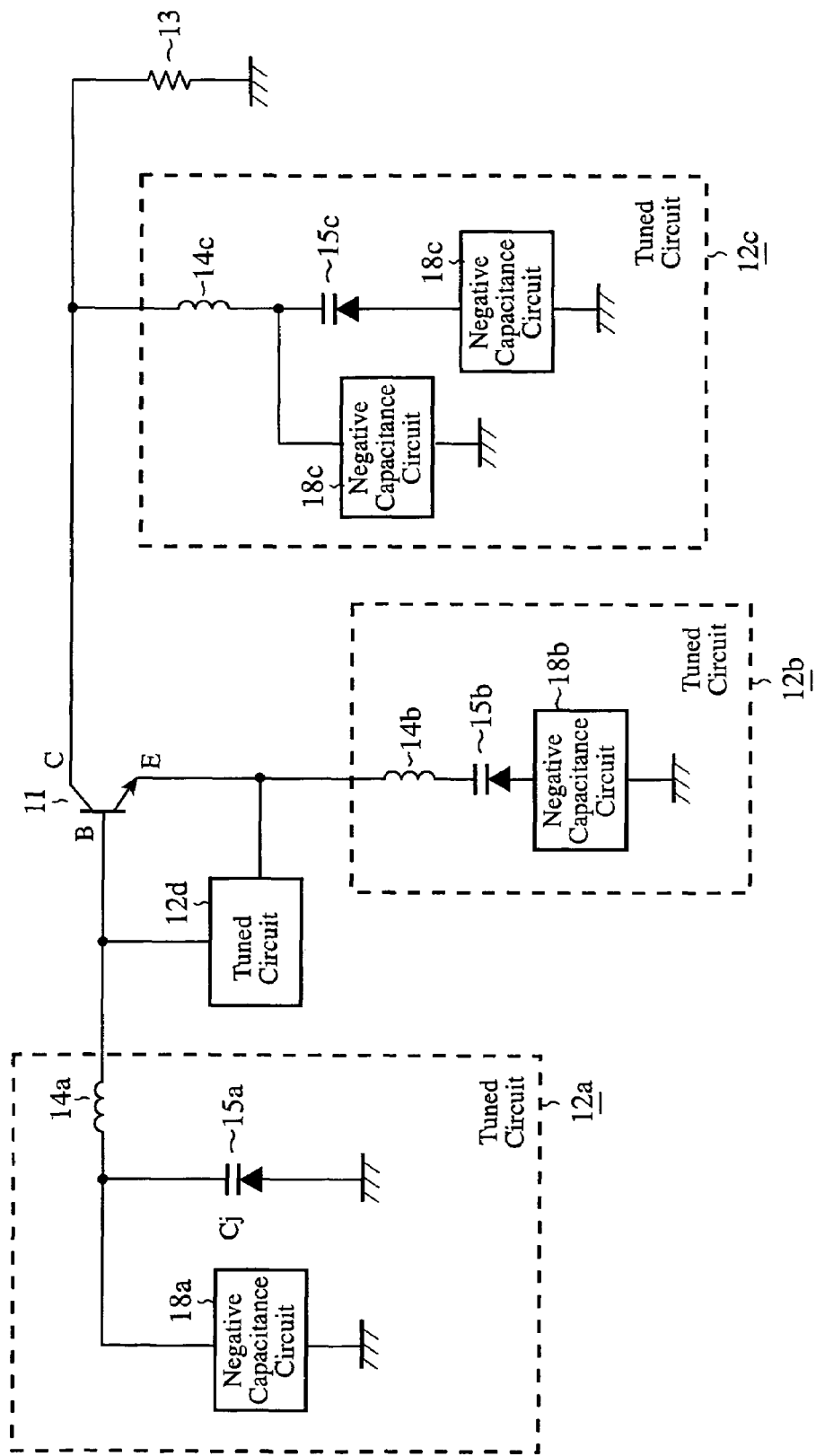
FIG. 32 is a circuit diagram showing another voltage-controlled oscillator of the embodiment 15 in accordance with the present invention.

FIG. 32 is a circuit diagram showing another voltage-controlled oscillator of the embodiment 15 in accordance with the present invention. In FIG. 32, the tuned circuit 12b has a negative capacitance circuit 18b connected in series with the variable-capacitance element 15b. The tuned circuit 12c has a negative capacitance circuit 18c connected in series with the variable-capacitance element 15c, and another negative capacitance circuit 18c connected in parallel with them. In this way, the tuned circuits 12 can be a series connection or parallel connection of the variable-capacitance element 15 and negative capacitance circuit 18, or a combination of the series connection and the parallel connection. In addition, not all the tuned circuits 12 require the connection of the negative capacitance circuit 18, offering a similar advantage.

As described above, the present embodiment 15 constructs the tuned circuits 12 from the negative capacitance circuit 18 connected in parallel with the variable-capacitance element 15. As a result, the present embodiment 15 can increase the variation ratio corresponding to the control voltage of the combined capacitance composed of the variable-capacitance element 15 and negative capacitance circuit 18, thereby being able to further broaden the oscillation frequency band.

INDUSTRIAL APPLICABILITY

As described above, the voltage-controlled oscillator in accordance with the present invention is applicable to radio observation, measuring instruments and the like.

What is claimed is:

1. A voltage-controlled oscillator comprising:
   a first reactance circuit connected to a first terminal of an active element for oscillation;
   a second reactance circuit connected to a second terminal of said active element for oscillation;
   a third reactance circuit connected to a third terminal of said active element for oscillation;
   a load resistance connected to said third reactance circuit for outputting oscillation power amplified by said active element for oscillation;
   a variable-capacitance element which is provided to at least one of said first to third reactance circuits and varies its capacitance in response to a control voltage, said variable-capacitance element being composed of a plurality of varactor diodes which are connected in series; and
   a negative capacitance circuit whose slope of impedance with respect to frequency is opposite to that of a normal capacitance, and which is connected to at least one variable-capacitance element of said one or a plurality of variable-capacitance elements.

2. The voltage-controlled oscillator according to claim 1, wherein said negative capacitance circuit is connected in parallel with said variable-capacitance element.

3. The voltage-controlled oscillator according to claim 1, wherein said negative capacitance circuit is connected in series with said variable-capacitance element.

4. The voltage-controlled oscillator according to claim 1, wherein said negative capacitance circuit comprises:
   a first field-effect transistor having its gate terminal connected to said variable-capacitance element, and its source terminal grounded;
   a second field-effect transistor having its drain terminal connected to the gate terminal of said first field-effect transistor, its source terminal grounded, and its gate terminal connected to a drain terminal of said first field-effect transistor; and
   an inductor connected to the drain terminal said first field-effect transistor.

5. The voltage-controlled oscillator according to claim 2, wherein said reactance circuit having said negative capacitance circuit connected comprises:
   a first negative capacitance circuit which is connected in series with a parallel circuit composed of said variable-capacitance element and negative capacitance circuit, and whose impedance frequency characteristics have opposite characteristics to those of a normal capacitance.

6. The voltage-controlled oscillator according to claim 3, wherein said reactance circuit having said negative capacitance circuit connected comprises:
a first negative capacitance circuit which is connected in parallel with a series circuit composed of said variable-capacitance element and negative capacitance circuit, and whose impedance frequency characteristics have opposite characteristics to those of a normal capacitance.

7. The voltage-controlled oscillator according to claim 1, comprising a first variable-capacitance element which is connected between the first terminal and second terminal of said active element for oscillation, and varies its capacitance in response to the control voltage.

8. The voltage-controlled oscillator according to claim 1, wherein said active element for oscillation is composed of a field-effect transistor.

9. The voltage-controlled oscillator according to claim 1, wherein said active element for oscillation is composed of a bipolar transistor.

10. A voltage-controlled oscillator comprising:
a first tuned circuit connected to a first terminal of an active element for oscillation, said first tuned circuit being a circuit which controls the oscillation frequency of the oscillator by forming a positive feedback path;
a second tuned circuit connected to a second terminal of said active element for oscillation, said second tuned circuit being a circuit which controls the oscillation frequency of the oscillator by forming a positive feedback path;
a third tuned circuit connected to a third terminal of said active element for oscillation, said third tuned circuit being a circuit which controls the oscillation frequency of the oscillator by forming a positive feedback path;
a load resistance connected to one of said first to third tuned circuits, for outputting oscillation power amplified by said active element for oscillation;
variable-capacitance elements which are provided to said first to said third tuned circuits each, and vary their capacitances in response to a control voltage; and
an inductor which is provided to at least one of said first to third tuned circuits, and is connected to the variable-capacitance element in the tuned circuit.

11. A voltage-controlled oscillator comprising:
tuned circuits connected to at least three locations out of six locations, the locations consisting of:
a first location corresponding to a first terminal of an active element for oscillation, a second location corresponding to a second terminal of said active element, a third location corresponding to a third terminal of said active element, a fourth location between the first terminal and second terminal and connected to both, a fifth location between the second terminal and third terminal and connected to both, and a sixth location between the third terminal and first terminal and connected to both, wherein at least one of said at least three locations is the fourth, fifth, or sixth location,
wherein each of said tuned circuits is a circuit which controls the oscillation frequency of the oscillator by forming a positive feedback path;
a load resistance connected to at least one of said three or more tuned circuits, for outputting oscillation power amplified by said active element for oscillation;
variable-capacitance elements which are provided to said three or more tuned circuits each, and vary their capacitances in response to a control voltage; and
an inductor which is provided to at least one of said three or more tuned circuits, and is connected to the variable-capacitance element in the tuned circuit.

12. A voltage-controlled oscillator comprising:
tuned circuits connected to at least three locations out of six locations, the locations consisting of:
a first location corresponding to a first terminal of an active element for oscillation, a second location corresponding to a second terminal of said active element, a third location corresponding to a third terminal of said active element, a fourth location between the first terminal and the second terminal and connected to both, a fifth location between the second terminal and third terminal, and connected to both, and a sixth location between the third terminal and first terminal and connected to both,
wherein each of said tuned circuits is a circuit which controls the oscillation frequency of the oscillator by forming a positive feedback path;
a load resistance connected to at least one of said three or more tuned circuits, for outputting oscillation power amplified by said active element for oscillation;
variable-capacitance elements which are provided to said three or more tuned circuits each, and vary their capacitances in response to a control voltage; and
an inductor which is provided to at least one of said three more tuned circuits, and is connected to the variable-capacitance element in the tuned circuit,
wherein said voltage-controlled oscillator further comprises a reactance circuit connected to at least one location of said six locations, wherein said at least one location is a location to which no tuned circuit is connected.

13. The voltage-controlled oscillator according to claim 10, wherein said variable-capacitance element is connected in series with said inductor.

14. The voltage-controlled oscillator according to claim 10, wherein said variable-capacitance element is connected in parallel with said inductor.

15. The voltage-controlled oscillator according to claim 10, wherein said variable-capacitance elements are each composed of a plurality of varactor diodes which are connected in series in a same direction.

16. The voltage-controlled oscillator according to claim 10, wherein said variable-capacitance elements are each composed of a plurality of varactor diodes which are connected in series in different directions.

17. The voltage-controlled oscillator according to claim 10, wherein at least one of said tuned circuits comprises:
a negative capacitance circuit whose impedance frequency characteristics have opposite characteristics to those of a normal capacitance, and which is connected in series with its associated variable-capacitance element.

18. The voltage-controlled oscillator according to claim 10, wherein at least one of said tuned circuits comprises:
a negative capacitance circuit whose impedance frequency characteristics have opposite characteristics to those of a normal capacitance, and which is connected in parallel with its associated variable-capacitance element.

19. The voltage-controlled oscillator according to claim 10, wherein said active element for oscillation is composed of a bipolar transistor.

20. The voltage-controlled oscillator according to claim 10, wherein said active element for oscillation is composed of a field-effect transistor.

21. The voltage-controlled oscillator according to claim 11, wherein said variable-capacitance element is connected in series with said inductor.

22. The voltage-controlled oscillator according to claim 11, wherein said variable-capacitance element is connected in parallel with said inductor.

23. The voltage-controlled oscillator according to claim 11, wherein said variable-capacitance elements are each composed of a plurality of varactor diodes which are connected in series in a same direction.

24. The voltage-controlled oscillator according to claim 11, wherein said variable-capacitance elements are each composed of a plurality of varactor diodes which are connected in series in different directions.

25. The voltage-controlled oscillator according to claim 11, wherein at least one of said tuned circuits comprises:
a negative capacitance circuit whose impedance frequency characteristics have opposite characteristics to those of a normal capacitance, and which is connected in parallel with its associated variable-capacitance element.

26. The voltage-controlled oscillator according to claim 11, wherein at least one of said tuned circuits comprises:
a negative capacitance circuit whose impedance frequency characteristics have opposite characteristics to those of a normal capacitance, and which is connected in parallel with its associated variable-capacitance element.

27. The voltage-controlled oscillator according to claim 11, wherein said active element for oscillation is composed of a bipolar transistor.

28. The voltage-controlled oscillator according to claim 11, wherein said active element for oscillation is composed of a field-effect transistor.

29. The voltage-controlled oscillator according to claim 12, wherein said variable-capacitance element is connected in series with said inductor.

30. The voltage-controlled oscillator according to claim 12, wherein said variable-capacitance element is connected in parallel with said inductor.

31. The voltage-controlled oscillator according to claim 12, wherein said variable-capacitance elements are each composed of a plurality of varactor diodes which are connected in series in a same direction.

32. The voltage-controlled oscillator according to claim 12, wherein said variable-capacitance elements are each composed of a plurality of varactor diodes which are connected in series in different directions.

33. The voltage-controlled oscillator according to claim 12, wherein at least one of said tuned circuits comprises:
a negative capacitance circuit whose impedance frequency characteristics have opposite characteristics to those of a normal capacitance, and which is connected in parallel with its associated variable-capacitance element.

34. The voltage-controlled oscillator according to claim 12, wherein at least one of said tuned circuits comprises:
a negative capacitance circuit whose impedance frequency characteristics have opposite characteristics to those of a normal capacitance, and which is connected in parallel with its associated variable-capacitance element.

35. The voltage-controlled oscillator according to claim 12, wherein said active element for oscillation is composed of a bipolar transistor.

36. The voltage-controlled oscillator according to claim 12, wherein said active element for oscillation is composed of a field-effect transistor.

* * * * *